(12) United States Patent
Moore et al.

(10) Patent No.: US 7,461,273 B2
(45) Date of Patent: Dec. 2, 2008

(54) POWER DISTRIBUTION AMONG SERVERS

(75) Inventors: Justin Moore, Durham, NC (US);
Parthasarathy Ranganathan, Fremont, CA (US); Ratnesh Sharma, Union City, CA (US); Janet Lynn Wiener, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 567 days.

(21) Appl. No.: 11/129,988

(22) Filed: May 16, 2005

(65) Prior Publication Data

US 2006/0259793 A1 Nov. 16, 2006

(51) Int. Cl.
*G06F 1/00* (2006.01)
*G06F 1/26* (2006.01)
*G06F 15/173* (2006.01)
(52) U.S. Cl. .................. 713/300; 713/320; 709/224
(58) Field of Classification Search ............ 713/300, 713/320; 709/224
See application file for complete search history.

(56) References Cited

U.S. PATENT DOCUMENTS 6,795,928 B2 * 9/2004 Bradley et al. .............. 713/320

2006/0047808 A1 * 3/2006 Sharma et al. .............. 709/224

OTHER PUBLICATIONS

Bianchini et al., Power and Energy Management for Server Systems, Nov. 2004, IEEE, pp. 68-76.*
Sharma et al., Balance of Power: Dynamic Thermal Management for Internet Data Centers, Feb. 18, 2003, pp. 1-13.*
Moore, J. et al., "Going Beyond CPUs: The Potential for Temperature-Aware Data Centers", Hewlett-Packard Development Co., L.P., Jun. 30, 2004.
Moore, J. et al., "Making Scheduling "Cool": Temperature-Aware Workload Placement in Data Centers", Apr. 13, 2005.

* cited by examiner

*Primary Examiner*—Mark Connolly

(57) ABSTRACT

A method of distributing power among servers is described includes calculating thermal multipliers of the servers, where the thermal multipliers represent recommended thermodynamic power consumption levels for the servers. In addition, the thermal multipliers of the servers are discretized to one of a plurality of server power states based upon geographic locations of the servers and one of the plurality of server power states is assigned to the servers based upon the discretization of the thermal multipliers.

31 Claims, 12 Drawing Sheets

500 ↘

| | | | |
|---|---|---|---|
| | (15)<br>112a | | |
| | (33)<br>112b | | |
| | (158)<br>112c | | |
| | (33)<br>112d | | |
| | (15)<br>112e | | |
| | (1.5)<br>112f | | |

| | | | |
|---|---|---|---|
| | (0)<br>112a | | |
| | (0)<br>112b | | |
| | (300)<br>112c | | |
| | (50)<br>112d | | |
| | (0)<br>112e | | |
| | (0)<br>112f | | |

| 102a | 102b | 102c | 102d |
|---|---|---|---|
| (1.5) | (15) | (1.5) | (15) |
| (18) | (33) | (33) | (23) |
| (33) | (158) | (15) | (21) |
| (16) | (33) | (55) | (25) |
| (1.5) | (15) | (38) | (55) |
| (100) | (1.5) | (5.5) | (3.5) |
| TOTALS: (170) | (255.5) | (148) | (142.5) |

| 102a | 102b | 102c | 102d |
|---|---|---|---|
| (1.5) | (15) | (1.5) | (15) |
| (18) | (33) | (33) | (23) |
| (33) | (158) | (15) | (21) |
| (16) | (33) | (55) | (25) |
| (1.5) | (15) | (38) | (55) |
| (100) | (1.5) | (5.5) | (3.5) |
| TOTALS: (0) | (400) | (0) | (400) |

FIG. 7B

| | 102a | 102b | 102c | 102d |
|---|---|---|---|---|
| | (0) | (18)<br>112f | (0) | (180) |
| | (0) | (33)<br>112e | (0) | (1.5) |
| | (0) | (150)<br>112d | (0) | (9) |
| | (0) | (142)<br>112c | (0) | (175) |
| | (0) | (55.5)<br>112b | (0) | (1.5) |
| | (0) | (1.5)<br>112a | (0) | (33) |
| TOTALS: | (0) | (400) | (0) | (400) |

*FIG. 7C*

| | 102a | 102b | 102c | 102d |
|---|---|---|---|---|
| | (0) | (50)<br>112e | (0) | (200) |
| | (0) | (50)<br>112d | (0) | (0) |
| | (0) | (200)<br>112d | (0) | (0) |
| | (0) | (50)<br>112c | (0) | (200) |
| | (0) | (50)<br>112b | (0) | (0) |
| | (0) | (0)<br>112a | (0) | (0) |
| TOTALS: | (0) | (400) | (0) | (400) |

*FIG. 7D*

POWER DISTRIBUTION AMONG SERVERS

BACKGROUND

A data center may be defined as a location, for instance, a room that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system containing multiple microprocessors dissipates approximately 250 W of power. Thus, a rack containing forty (40) computer systems of this type dissipates approximately 10 KW of power.

Current approaches to provisioning cooling to dissipate the heat generated by the cooling systems are typically based on using energy balance to size the air conditioning units and intuition to design air distributions in the data center. In many instances, the provisioning of the cooling is based on the nameplate power ratings of all of the servers in the data center, with some slack for risk tolerance. This type of cooling provisioning oftentimes leads to excessive and inefficient cooling solutions. This problem is further exacerbated by the fact that in most data centers, the cooling is provisioned for worst-case or peak load scenarios. Since it is estimated that typical data center operations only utilize a fraction of the servers, provisioning for these types of scenarios often increases the inefficiencies found in conventional cooling arrangements.

As such, it would be beneficial to have effective thermal management that does not suffer from the inefficiencies found in conventional data center cooling arrangements.

SUMMARY OF THE INVENTION

A method of distributing power among servers is described. In the method, thermal multipliers of the servers are calculated, where the thermal multipliers represent recommended power consumption levels for the servers. In addition, the thermal multipliers of the servers are discretized to one of a plurality of server power states based upon geographic locations of the servers and one of the plurality of server power states is assigned to the servers based upon the discretization of the thermal multipliers.

BRIEF DESCRIPTION OF THE DRAWINGS

Features of the present invention will become apparent to those skilled in the art from the following description with reference to the figures, in which:

FIG. 5A depicts a simplified diagram of a row of racks, each housing a number of servers, with the thermal multipliers depicted for some of the servers;

FIG. 5B depicts a simplified diagram of a row of racks, each housing a number of servers, with the thermal multipliers depicted for some of the servers following a poaching operation depicted in FIG. 4A;

FIGS. 7A-7D, each show simplified diagrams of a row of racks, each housing a number of servers, with the thermal multipliers depicted for the servers at various steps of the operational mode depicted in FIG. 6A, according to an embodiment of the invention.

DETAILED DESCRIPTION OF THE INVENTION

Figure 1A:
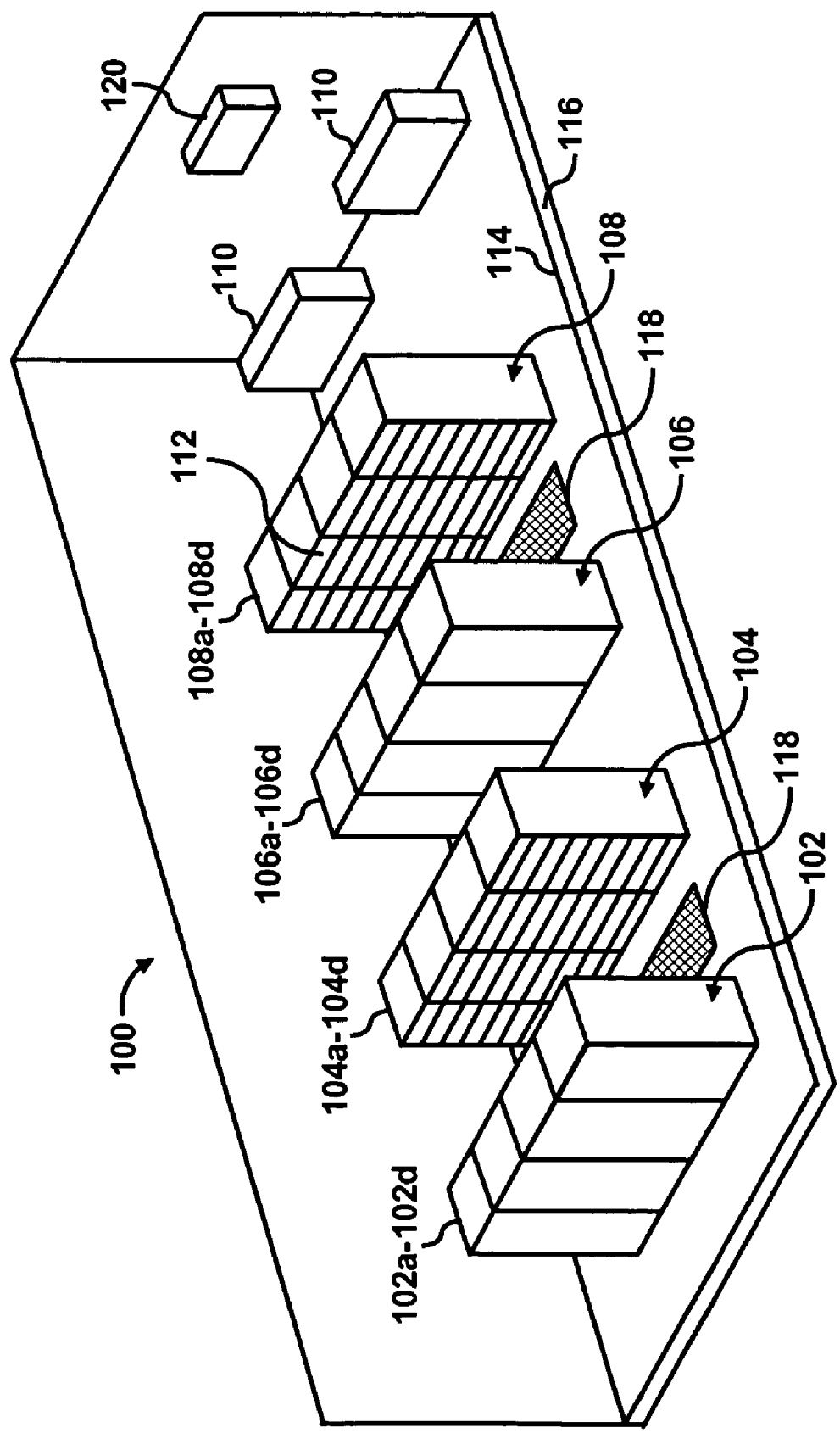
FIG. 1A shows a simplified perspective view of a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

The effectiveness of a server thermal package generally depends on external environmental controls to maintain inlet air temperatures within a safe operating range below the "redline" of approximately 25° C. A variety of factors may cause temperature variations and thermal hot spots in the data center. For instance, non-uniform equipment loads in the data center may cause some areas to have higher temperatures as compared with other areas, while irregular airflows may cause some areas to have lower temperatures than other areas. In data centers having relatively high heat densities, for instance, heat dissipation of around 2000 W/m$^2$ (200 W/ft$^2$) or more, mixing of hot and cold streams generally leads to complex airflow patterns that can create hot spots. Hot spots typically create a risk of redlining servers by exceeding the specified maximum inlet air temperature, damaging electronic components and causing them to fail prematurely. In addition, thermal imbalances often interfere with efficient cooling operation.

As described below, power distribution algorithms are implemented to maintain a substantially balanced temperature distribution in a geographically collocated cluster of compute equipment (hereinafter "data center"), such as, a data center, a collection of racks, a single rack, a cluster of servers, etc. To achieve this balance, the workload placement algorithms generally "discretize" a substantially ideal thermodynamic "analog distribution" of how power should be distributed among a plurality of servers. The "analog distribution" is discretized by the power distribution algorithms because, in one respect, current servers have defined power states and thus are typically incapable of operating under the ideal analog distributions. The power state of a server may be increased from an analog distribution value to one of several discrete power states, for instance, a discrete lower power state and a discrete higher power state. In addition, the discretization of the analog distribution is based in part on the geographic locations of the servers and the thermodynamic distributions of the servers in the vicinities of the servers, as described in greater detail herein below.

In a first example, the server may effectively "poach" or borrow the analog distribution value from a nearby or neighboring server to increase its power state to one of the discrete power states. The amount poached (or the poaching factor) from a nearby or neighboring server may be based upon, for instance, a function of the distance between the poaching server ("poacher") and the poached server ("poachee"). In addition, the poachee is de-weighted by a poaching factor that is based upon the amount that is borrowed from the poachee.

In a second example, a two-pass approach based upon a proximity-based heat distribution and is performed to discretize the analog distribution values of the servers. The first pass calculates the target power consumption for each rack, and translates that into an appropriate number of servers to use in each rack. The second pass then selects which of the servers to use within the racks.

With reference first to FIG. 1A, there is shown a simplified perspective view of a data center 100. The terms "data center" are generally meant to denote a room or other space and are not meant to limit the invention to any specific type of room where data is communicated or processed, nor should it be construed that use of the terms "data center" limits the invention in any respect other than its definition hereinabove. The terms "data center" as referenced throughout the present disclosure may also denote any physically collocated collection of computing equipment, such as, for instance, computing equipment contained in a single rack, a cluster of racks, etc. In addition, although particular reference is made throughout to CRAC units, various other types of air conditioning units may be employed. For instance, if the "data center" as referenced herein comprises a rack of computing equipment, the CRAC units may comprise, for instance, server air conditioning units, fans and cooling systems specific to the rack, etc.

The data center 100 depicted in FIG. 1A represents a generalized illustration and other components may be added or existing components may be removed or modified without departing from a scope of the data center 100. For example, the data center 100 may include any number of racks and various other apparatuses known to be housed in data centers. Thus, although the data center 100 is illustrated as containing four rows of racks 102-108 and two computer room air conditioning (CRAC) units 110, it should be understood that the data center 100 may include any number of racks, for instance, 100 racks, and CRAC units 110. The depiction of four rows of racks 102-108 and two CRAC units 110 is thus for illustrative and simplicity of description purposes only and is not intended to limit the data center 100 in any respect.

The data center 100 is depicted as having a plurality of racks 102-108, for instance, electronics cabinets, aligned in substantially parallel rows. The racks 102-108 are illustrated as having open front sides such that the components 112 housed therein are visible. It should, however, be understood that the data center 100 may include racks 102-108 having panels that cover the front sides of the racks 102-108 without departing from a scope of the data center 100.

The components 112 may comprise, for instance, computers, servers, monitors, hard drives, disk drives, etc., designed to perform various operations, for instance, computing, switching, routing, displaying, etc. These components 112 may comprise subsystems (not shown), for example, processors, micro-controllers, high-speed video cards, memories, semi-conductor devices, and the like to perform these functions. In the performance of these electronic functions, the subsystems and therefore the components 112, generally dissipate relatively large amounts of heat. Because the racks 102-108 have generally been known to include upwards of 200 or more components 112, they may require substantially large amounts of cooling resources to maintain the subsystems and the components 112 generally within predetermined operating temperature ranges.

A relatively small number of components 112 are illustrated as being housed in the racks 102-108 for purposes of simplicity. It should, however, be understood that the racks 102-108 may include any number of components 112, for instance, forty or more components 112, or 200 or more blade systems. In addition, although the racks 102-108 are illustrated as containing components 112 throughout the heights of the racks 102-108, it should be understood that some of the racks 102-108 may include slots or areas that do not include components 112 without departing from the scope of the racks 102-108.

The rows of racks 102-108 are shown as containing four racks (a-d) positioned on a raised floor 114. A plurality of wires and communication lines (not shown) may be located in a space 116 beneath the raised floor 114. The space 116 may also function as a plenum for delivery of cooling airflow from the CRAC units 110 to the racks 102-108. The cooled airflow may be delivered from the space 116 to the racks 102-108 through a plurality of vent tiles 118 located between some or all of the racks 102-108. The vent tiles 118 are shown in FIG. 1A as being located between racks 102 and 104 and 106 and 108. One or more temperature sensors (not shown) may also be positioned in the space 116 to detect the temperatures of the airflow supplied by the CRAC units 110.

The CRAC units 110 generally operate to receive heated airflow from the data center 100, cool the heated airflow, and to deliver the cooled airflow into the plenum 116. The CRAC units 110 may comprise vapor-compression type air conditioning units, water-chiller type air conditioning units, etc. In one regard, the CRAC units 110 may operate in manners generally consistent with conventional CRAC units 110. Alternatively, the CRAC units 110 and the vent tiles 118 may be operated to vary characteristics of the cooled airflow delivery as described, for instance, in commonly assigned U.S. Pat. No. 6,574,104, filed on Oct. 5, 2001, which is hereby incorporated by reference in its entirety.

Also illustrated in FIG. 1A is a resource manager 120, depicted as an individual computing device. Although the resource manager 120 is illustrated as being separate from and located away from the racks 102-108, the resource manager 120 may also comprise a server or other computing device housed in one of the racks 102-108. In addition, if the resource manager 120 is comprised in a server or other computing device, the resource manager 120 may be implemented on the local application scheduler level, the operating system, virtual machine scheduler, hardware, etc. In any regard, the resource manager 120 is generally configured to control various operations in the data center 100. For instance, the resource manager 120 may be configured to control power distribution amongst the various components 112, as described in greater detail hereinbelow. As another example, the resource manager 120 may be configured to control various operations of the CRAC units 110 and the vent tiles 118, collectively considered herein as the cooling system.

The CRAC units 110 may include sensors (not shown) configured to detect at least one environmental condition, for instance, temperature, pressure, humidity, etc. These sensors may comprise any reasonably suitable conventional sensors configured to detect one or more of these environmental conditions. The sensors may be positioned at various locations of the data center 100. The sensors may be positioned, for instance, to detect the temperature of the cooled airflow supplied by the CRAC units 110. The sensors may comprise devices separate from the CRAC units 110 or they may comprise devices integrated with the CRAC units 110.

Figure 1B:
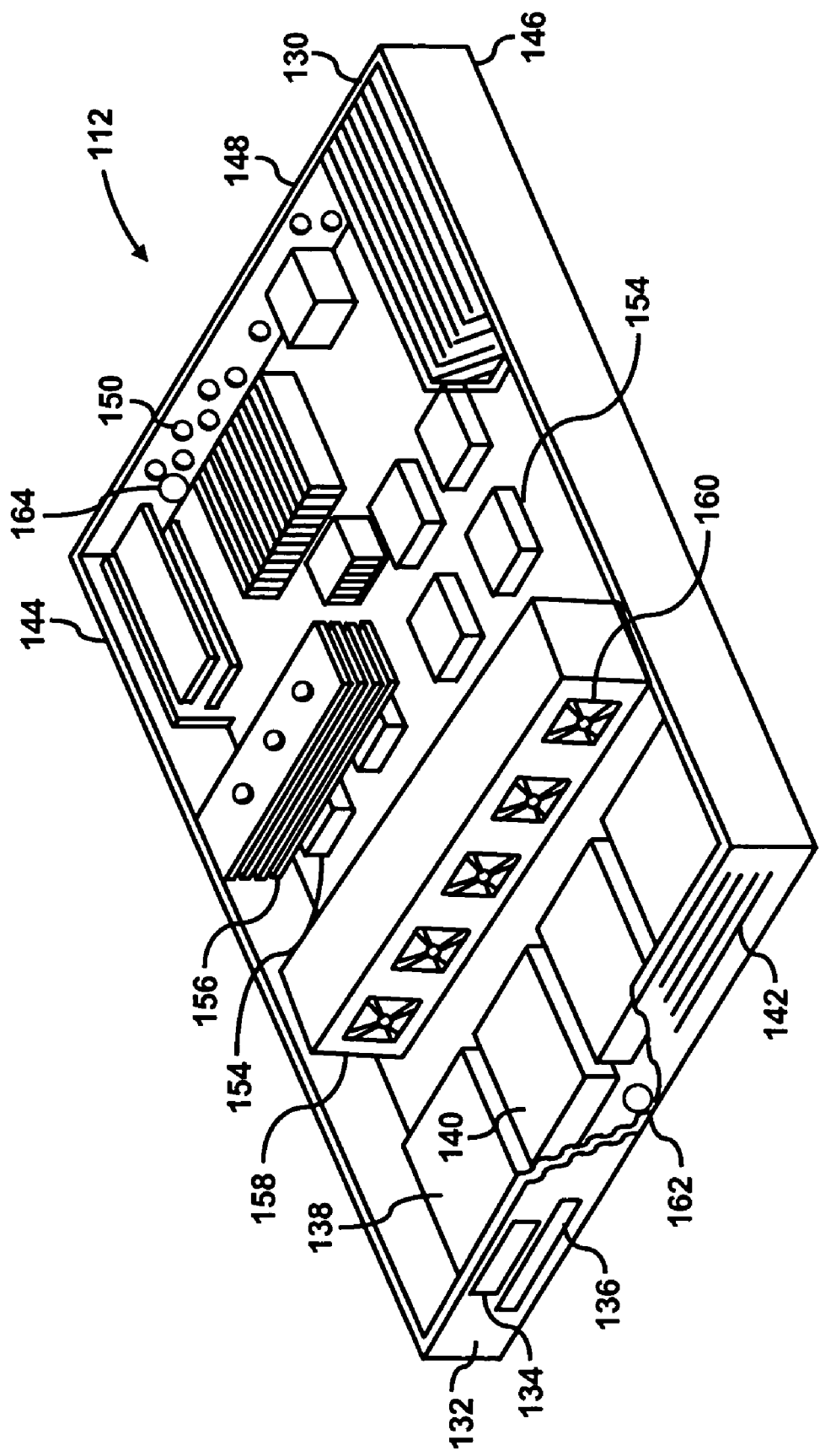
FIG. 1B is a perspective view of a component that may be housed in the racks depicted in FIG. 1A.

FIG. 1B is a perspective view of a component 112, depicted here as a server, that may be housed in the racks 102-108 depicted in FIG. 1A. The component 112 may comprise a server that is configured for substantially horizontal mounting in a rack 102-108 or a server that is configured for substantially vertical mounting in a rack 102, 108, such as, a blade system. In any regard, the component 112 will be considered as a server throughout the present disclosure. In addition, it should be understood that the server 112 depicted in FIG. 1B represents a generalized illustration and, therefore, other devices and design features may be added or existing devices or design features may be removed, modified, or rearranged without departing from the scope of the server 112. For example, the server 112 may include various openings for venting air through an interior of the server 112. As another example, the locations of the various devices shown in the server 112 may be re-positioned.

As shown in FIG. 1B, the server 112 includes a housing 130 with a top section of the housing 130 removed for purposes of illustration. In addition, a part of a front section 132 of the housing 130 has been cut-away to more clearly show some of the devices contained in the server 112. The front section 132 is illustrated as containing various features to enable access to various devices contained in the server 112. For instance, the front section 132 is shown as including openings 134 and 136 for insertion of various media, for example, diskettes, flash memory cards, CD-Roms, etc. Located substantially directly behind the openings 134 and 136 are data storage devices 138 and 140 configured to read and/or write onto the various media. The front section 132 also includes vents 142 for enabling airflow into an interior of the housing 130.

The housing 130 also includes a plurality of side sections 144 and 146 and a rear section 148. The rear section 148 includes openings 150 to generally enable airflow out of the housing 130. Although not clearly shown in FIG. 1B, the rear section 148 also includes openings for insertion of wires, cables, and the like, into the housing 130 for connection to various devices contained in the housing 130. In addition, some of the openings 150 in the rear section 148 may include devices to enable the interfacing of certain devices contained in the housing 130 with various other electronic devices.

Contained within the housing 130 is a plurality of electronic components 154 which, during operation, generate heat (hereinafter referred to as "heat-generating devices"). Some of the heat-generating devices 154 may comprise microprocessors, power converters, memories, memory controllers, power supplies, disk drives, etc. In addition, some of the heat-generating devices 154 may include heat sinks 156 configured to dissipate relatively larger amounts of heat generated by these devices 154 by providing a relatively larger surface area from which heat may be dissipated through convection.

Also illustrated in the server 112 is an optional fan cell 158. The fan cell 158 is considered optional because the additional airflow produced through use of the fan cell 158 may not be required in certain servers 112. In any regard, the optional fan cell 158 is depicted as being composed of fans 160 for blowing air through the server 112. The optional fan cell 158 is depicted as containing five fans 160 for illustrative purposes only and may therefore contain any reasonably suitable number of fans, for instance, from 1 to 10 or more fans. The fans 160 contained in the fan cell 158 may comprise relatively low capacity fans or they may comprise high capacity fans that may be operated at low capacity levels. In addition, the fans may have sufficiently small dimensions to enable their placement in the housing 130 without, for instance, substantially interfering with the operations of other devices contained in the server 112. Moreover, the optional fan cell 158 may be positioned at locations in or around the server 112 without departing from a scope of the server 112.

The server 112 is also illustrated as including an outlet temperature sensor 162. The outlet temperature sensor 162 is configured to detect the temperature of the airflow exiting the server 112. The temperature sensor 162 may comprise any reasonably suitable temperature sensor, such as, a thermocouple, thermistor, thermometer, etc. In addition, the temperature sensor 162 may be integrally manufactured with the server 112 or the temperature sensor 162 may be installed in the server 112 as an after-market device.

As will be described in greater detail below, the temperature measurements obtained through use of the temperature sensor 162 may be employed to calculate an ideal thermodynamic power consumption level (or thermal multiplier) for the server 112. The resource manager 120 may use the ideal thermodynamic power consumption level for the server 112 in algorithms designed to select a discrete power state for the server 112.

The discrete power state for the server 112 may be based upon the available power states of the heat generating devices 154 contained in the server 112. In general, the heat generating devices 154 have several discrete power states at which they are operated and may thus be incapable of operating at ideal thermodynamic power consumption levels. By way of example, the heat generating devices 154 may have a first power state and a second power state. The first power state may be equivalent to one of an idle power state and an "off" state, and the second power state may be equivalent to a power state in which the heat generating devices 154 are fully operational. Although the heat generating devices 154 may have additional power states, two power states are described here for purposes of simplicity. It should, therefore, be understood that the principles described herein are applicable to heat generating devices 154 having additional power states.

Conventionally, operation of a heat generating device 154 under the two power states may yield inefficient energy usage. For instance, if the ideal thermodynamic power consumption level is below the second power state, but the heat generating device 154 is operating at the second power state, the heat generating device 154 may be considered as consuming an excessive amount of energy for that location. This excess energy consumed by the heat generating devices 154 of a number of servers 112 may lead to the need for extra cooling resources. In addition, this type of energy consumption may lead to hot spots in the data center 100 as relatively large numbers of servers 112 consuming excess amounts of energy may dissipate relatively large amounts of heat. Similarly, at locations where the power states are lower than the ideal thermodynamic power consumption level, there are cold spots that again represent inefficiencies in cooling.

Various algorithms are described below for distributing power among the servers 112 to substantially reduce the level of inefficiencies in power consumption levels while also substantially preventing the formation of hot spots in the data center 100. Initially, however, a system depicting an environment in which the algorithms may be implemented is discussed with respect to FIG. 2.

Figure 2:
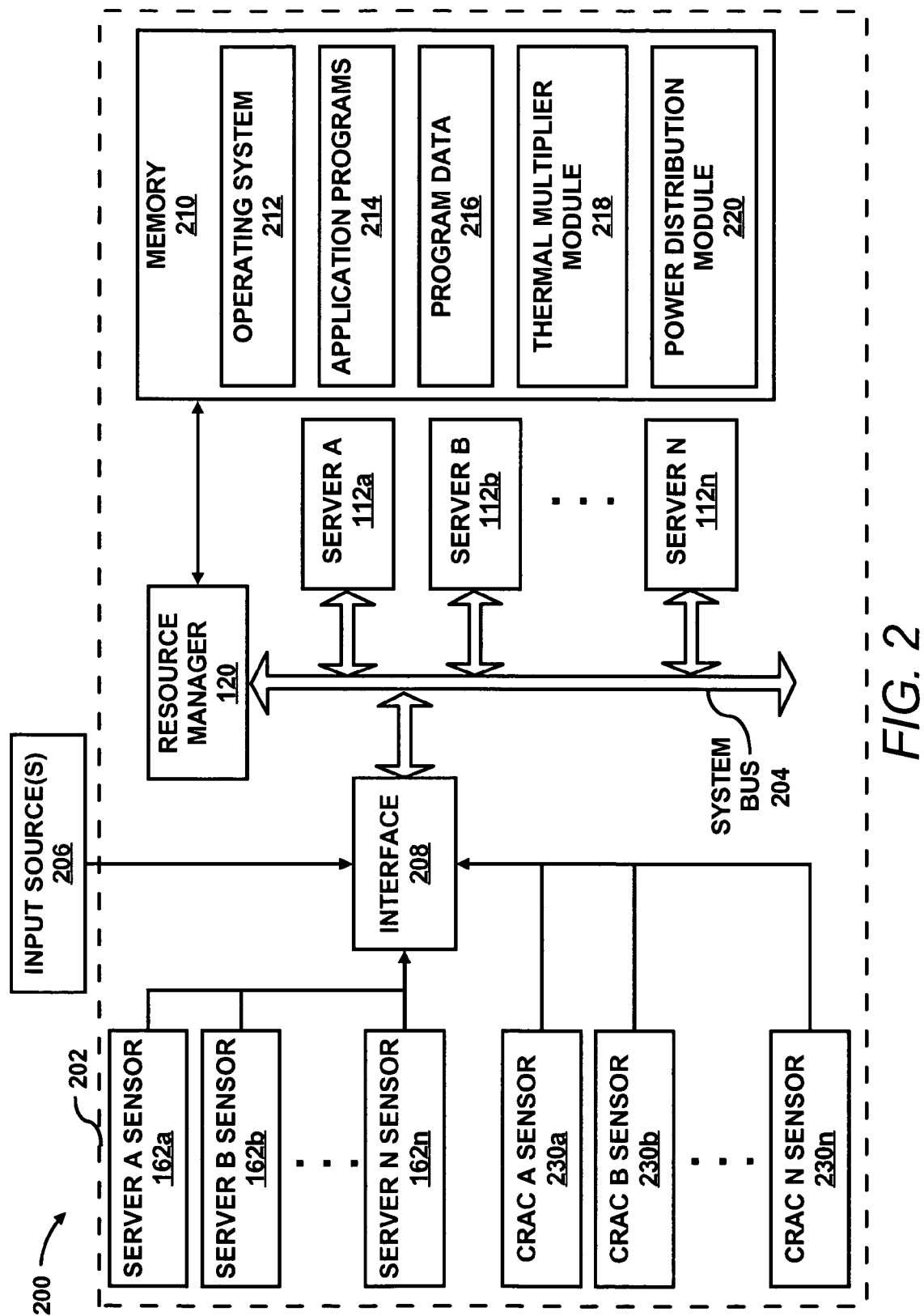
FIG. 2 is a block diagram of a power distribution system according to an embodiment of the invention.

More particularly, FIG. 2 is a block diagram 200 of a power distribution system 202 that may implement the algorithms described below. It should be understood that the following description of the block diagram 200 is but one manner of a variety of different manners in which such a power distribution system 202 may be configured. In addition, it should be understood that the power distribution system 202 may include additional components and that some of the components described herein may be removed and/or modified without departing from the scope of the power distribution system 202. For instance, the power distribution system 202 may include any number of sensors, servers, CRAC units, etc., as well as other components, which may be implemented in the operations of the power distribution system 202.

As shown, the power distribution system 202 may comprise a general computing environment and includes the resource manager 120 depicted in FIG. 1A. As described herein above, the resource manager 120 is configured to perform various functions in the data center 100. In this regard, the resource manager 120 may comprise a computing device, for instance, a computer system, a server, etc. In addition, the resource manager 120 may comprise a microprocessor, a micro-controller, an application specific integrated circuit (ASIC), and the like, configured to perform various processing functions. In one respect, the resource manager 120 may comprise a controller of another computing device.

Data may be transmitted to various components of the power distribution system 202 over a system bus 204 that operates to couple the various components of the power distribution system 202. The system bus 204 represents any of several types of bus structures, including, for instance, a memory bus, a memory controller, a peripheral bus, an accelerated graphics port, a processor bus using any of a variety of bus architectures, and the like.

One or more input sources 206 may be employed to input information into the power distribution system 202. The input sources 206 may comprise, for instance, computing devices connected over an internal network or an external network, such as, the Internet. The input sources 206 may also comprise peripheral devices, such as, a disk drive, removable media, flash drives, a keyboard, a mouse, and the like. The input sources 206 may be used, for instance, as a means to request that a workload or application be performed by some of the servers 112 in the data center 100. By way of example, a request to perform a multimedia application may be received into the power distribution system 202 from or through an input source 206.

The resource manager 120 may communicate with the input source 206 via an Ethernet-type connection or through a wired protocol, such as IEEE 802.3, etc., or wireless protocols, such as IEEE 802.11b, 802.11g, wireless serial connection, Bluetooth, etc., or combinations thereof. In addition, the input source 206 may be connected to the resource manager 120 through an interface 208 that is coupled to the system bus 204. The input source 206 may, however, be coupled by other conventional interface and bus structures, such as, parallel ports, USB ports, etc.

The resource manager 120 may be connected to a memory 210 through the system bus 204. Alternatively, the resource manager 120 may be connected to the memory 210 through a memory bus, as shown in FIG. 2. Generally speaking, the memory 210 may be configured to provide storage of software, algorithms, and the like, that provide the functionality of the power distribution system 202. By way of example, the memory 210 may store an operating system 212, application programs 214, program data 216, and the like. The memory 210 may be implemented as a combination of volatile and non-volatile memory, such as DRAM, EEPROM, MRAM, flash memory, and the like. In addition, or alternatively, the memory 210 may comprise a device configured to read from and write to a removable media, such as, a floppy disk, a CD-ROM, a DVD-ROM, or other optical or magnetic media.

The memory 210 may also store modules programmed to perform various power distribution functions. More particularly, the memory 210 may store a thermal multiplier module 218 and a power distribution module 220. In addition, the resource manager 120 may be configured to implement the modules 218 and 220 stored in the memory 210 to perform some or all of the power distribution functions.

The resource manager 120 may implement the thermal multiplier module 218 to calculate the ideal thermodynamic power consumption levels or thermal multipliers ($P_i$) of the servers 112a-112n. The servers A-N are denoted by servers 112a-112n, where "n" is a non-negative integer. The ellipses between server 112b and server 112n generally indicate that the resource manager 120 may control the power states of any reasonably suitable number of servers 112a-112n. The resource manager 120 may calculate the thermal multipliers ($P_i$) of the servers 112a-112n through the following equation:

Equation (1):

$$P_i = \frac{T_{base} - T_{ref}}{T_i - T_{ref}} \cdot P_{base}.$$

In Equation (1), $P_i$ may be considered as the "optimal" power consumption level for a server i. $T_{ref}$ is the temperature of the air provided by the CRAC units 110, and $T_i$ is the current exhaust temperature of the server i. $T_{base}$ and $P_{base}$ are the average exhaust temperature and power consumption of one or more "baseline" servers. $T_{base}$ and $P_{base}$ may be set based upon the temperature and power consumption at an arbitrary location in solving Equation (1). A more detailed description of Equation (1) may be found in the article by Sharma, R, Bash, C. E., Patel, C. D., Friedrich, R., Chase, J., "Balance of Power: Dynamic Thermal Management for Internet Data Centers", IEEE Internet Computing, Vol. 9, No. 1, pp. 42-49. The disclosure contained in that article is hereby incorporated by reference in its entirety.

The temperatures of the air provided by the CRAC units 110 ($T_{ref}$) may be detected by respective CRAC temperature sensors A-N 230a-230n, where "n" is a non-negative integer. More particularly, the CRAC temperature sensors 230a-230n may be positioned to detect the temperature of airflow supplied by respective CRAC units 110. The ellipses between CRAC sensor 230b and CRAC sensor 230n generally indicate that the resource manager 120 may receive temperature information from any reasonably suitable number of CRAC temperature sensors.

The temperatures of the air exhausted from the servers 112a-112n ($T_i$) may be detected by respective server temperature sensors A-N 162a-162n, where "n" is a non-negative integer. More particularly, the server temperature sensors 162a-162n may be positioned to detect the temperature of airflow exhausting from the respective servers 112a-112n, for instance, as shown in FIG. 1B. The ellipses between server temperature sensor 162b and server temperature sensor 162n generally indicate that the resource manager 120 may receive temperature information from any reasonably suitable number of server temperature sensors.

The temperature information obtained by the CRAC temperature sensors 230a-230n and the server temperature sensors 162a-162n may be communicated to the resource manager 120 through use of any reasonably suitable known hardware and/or software configured to enable such communications. By way of example, the resource manager 120 and the temperature sensors 230a-230n, 162a-162n may include network adaptors (not shown) configured to enable wired or wireless information transfer between the temperature sensors 230a-230n, 162a-162n and the resource manager 120. In addition, or alternatively, either or both of the resource manager 120 and the temperature sensors 230a-230n, 162a-162n may include software designed to enable the information transfer.

In any regard, the thermal multipliers ($P_i$) are considered as being "optimal" because operating the servers 112a-112n at these power levels yield an optimally uniform profile of the exhaust from the servers 112a-112n, thereby reducing or eliminating hot spots in the data center 100. In addition, these thermal multipliers ($P_i$) yield an analog power distribution among the servers 112a-112n that may include any of a number of power levels between an upper and a lower power level. By way of example, the thermal multipliers ($P_i$) of the servers 112a-112n may range from 0 to 600 Watts and a server 112a may have a thermal multiplier ($P_i$) of 271 Watts and another server 112b may have a thermal multiplier ($P_i$) of 350 Watts. Operating the servers 112a-112n at their calculated ideal thermodynamic power consumption levels ($P_i$) may provide for an optimized power usage; however, the servers 112a-112n typically may not be operated at the ideal power levels because the servers 112a-112n have discrete power states.

While one method of computing the thermal multipliers ($P_i$) has been discussed above, the thermal multipliers ($P_1$) may be generated in several other ways based on other specific methods of optimization, for example, dimensionless parameters such as SHI, look-up tables based upon actual measurements, or any other thermodynamic formulation that will be evident to one skilled in the art may be used to compute the thermal multipliers ($P_i$). SHI is discussed in co-pending and commonly assigned U.S. patent application Ser. No. 10/446,854, filed on May 29, 2003, the disclosure of which is hereby incorporated by reference in its entirety. SHI, thermal multipliers and knowledge of discrete power states are also described in co-pending and commonly assigned U.S. patent application Ser. No. 10/929,448, filed on Aug. 31, 2004, the disclosure of which is hereby incorporated by reference in its entirety. The thermal multipliers ($P_i$) may also, or in the alternative, be based upon history-based profiling, as discussed in co-pending and commonly assigned U.S. patent application Ser. No. 11/129,986, filed on May 16, 2005, and entitled "Historical Data Based Workload Allocation", the disclosure of which is hereby incorporated by reference in its entirety.

More particularly, for instance, the servers 112a-112n may have a first power state and a second power state. By way of example, the first power state may be equivalent to an idle mode and the second power state may be equivalent to a fully-utilized mode. As described in greater detail herein below, the thermal multipliers ($P_i$) of the servers 112a-112n calculated through Equation (1) may be discretized and used as a basis for distributing power among the servers 112a-112n.

The resource manager 120 may implement the power distribution module 220 to determine the power states of the servers 112a-112n based upon the discretization of the server 112a-112n thermal multipliers. In a first example, the resource manager 120 may employ the power distribution module 220 to selectively "poach" power from certain servers 112a-112n and give that power to certain other servers 112a-112n. This example is described in greater detail with respect to the operational mode 300 depicted in FIGS. 3A, and 4A-4C. In a second example, the resource manager 120 may employ the power distribution module 220 to perform a two-pass discretization approach of the servers 112a-112n. The second example is described in greater detail herein below with respect to FIGS. 3A, 3B, 5A and 5B.

Once the resource manager 120 has determined the suitable power states for the servers 112a-112n according to one or more of the operational modes 300, 400 and 500 depicted below, the resource manager 120 may vary the power states of the servers 112a-112n. The resource manager 120 may control the power states of the servers 112a-112n by, for instance, controlling the operating states of at least one processor contained in each of the servers 112a-112n. For instance, if the server 112a has a single heat generating device 154, the heat generating device 154 may have two discrete power states, a first power state and a second power state. The resource manager 120 may thus control the power state of the heat generating device 154 to make the server 112a operate at one of the two discrete power states. As another example, if the server 112a has two heat generating devices 154, each with two discrete power states, the resource manager 120 may control the power states of the heat generating devices 154 to make the server 112a operate at one of four discrete power states. As may be seen, the number of power states for a given server 112a-112n may be based upon the number of heat generating devices 154 contained in the server 112a-112n.

Communications between the resource manager 120 and the servers 112a-112n may be effectuated through use of any reasonably suitable known hardware and/or software configured to enable such communications. By way of example, the resource manager 120 and the servers 112a-112n may each include network adaptors (not shown) configured to enable wired or wireless information transfer between the resource manager 120 and the servers 112a-112n. In addition, or alternatively, either or both of the resource manager 120 and the servers 112a-1112n may include software designed to enable the information transfer.

Figure 3A:
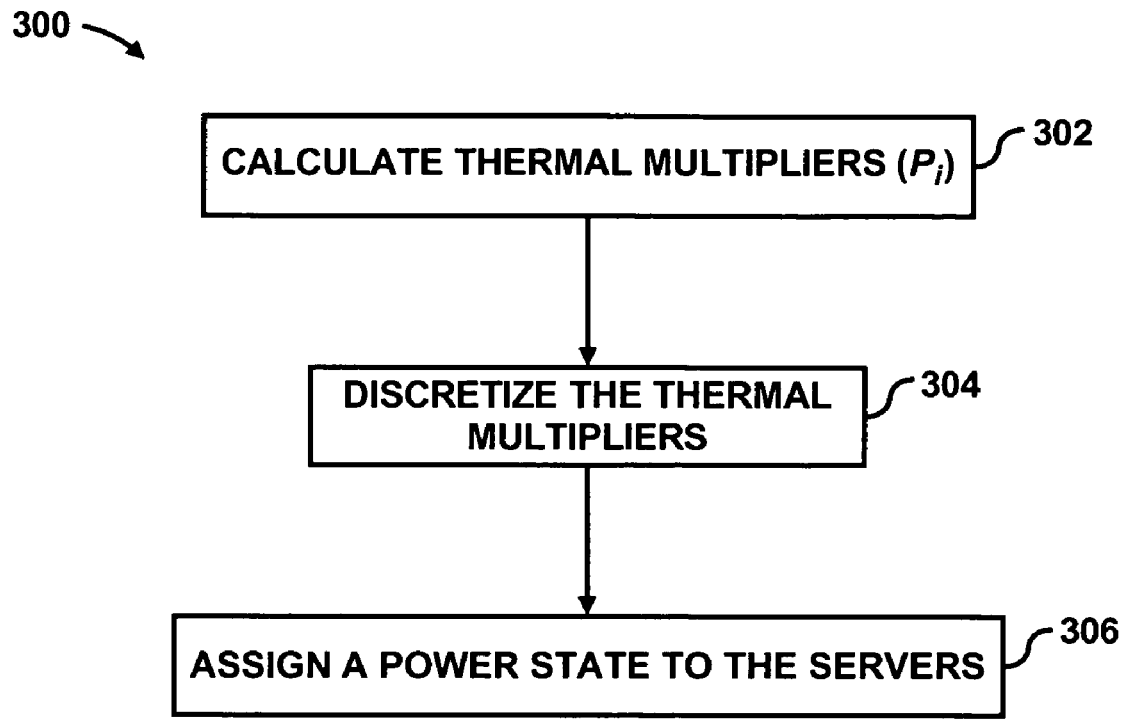
FIG. 3A illustrates a flow diagram of an operational mode for distributing power among servers, according to an embodiment of the invention.

With reference now to FIG. 3A, there is shown a flow diagram of an operational mode 300 for distributing power among servers. It is to be understood that the following description of the operational mode 300 is but one manner of a variety of different manners in which an embodiment of the invention may be practiced. It should also be apparent to those of ordinary skill in the art that the operational mode 300 represents a generalized illustration and that other steps may be added or existing steps may be removed, modified or rearranged without departing from a scope of the operational mode 300.

The description of the operational mode 300 is made with reference to the block diagram 200 illustrated in FIG. 2, and thus makes reference to the elements cited therein. It should, however, be understood that the operational mode 300 is not limited to the elements set forth in the block diagram 200. Instead, it should be understood that the operational mode 300 may be practiced by a power distribution system having a different configuration than that set forth in the block diagram 200.

The operational mode 300 may be performed to distribute power among servers 112a-112n. The thermal multipliers ($P_i$) for the servers may be calculated at step 302. In addition, the thermal multipliers of the servers 112a-112n may be discretized to one of a plurality of server power states based upon geographic locations of the servers at step 304. The discretization of the thermal multipliers may include an iterative multi-step procedure in which the thermal multipliers of the servers 112a-112n are discretized based upon geographically clustered collections of racks in increasing granularity. In addition, or alternatively, the discretization of the thermal multipliers may include an iterative multi-step procedure in which the thermal multipliers of the servers 112a-112n are discretized may be based upon a sequential ordering of the thermal multipliers, where the highest multiplier is used first in discretizing the thermal multipliers. Moreover, the servers 112a-112n may be assigned one of the plurality of server power states based upon the discretization of the thermal multipliers ($P_i$). The operational mode 300 generally includes steps that are defined in greater detail with respect to FIGS. 4A and 5A below.

Figure 3B:
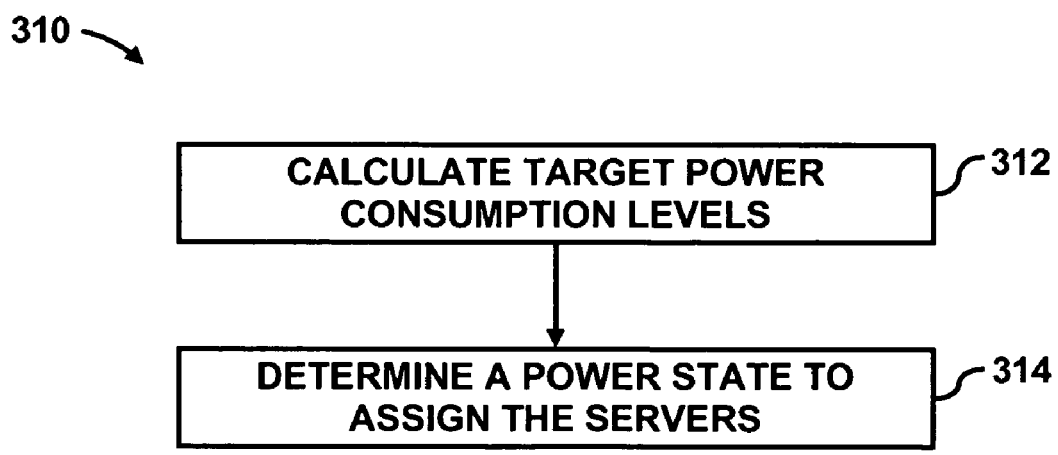
FIG. 3B illustrates a flow diagram of an operational mode, which depicts in greater detail, a step in the operational mode depicted in FIG. 3A, according to an embodiment of the invention.

Turning to FIG. 3B, there is shown an operational mode 310, which depicts, in greater detail, step 304 in the operational mode 300. More particularly, at step 312, the target power consumption levels for a plurality of racks in a row of racks are calculated. In addition, the one of the plurality of power states to assign to the servers contained in the plurality of racks is determined at step 314. The operational mode 310 generally includes steps that are defined in greater detail with respect to FIG. 5A below.

Figure 4A:
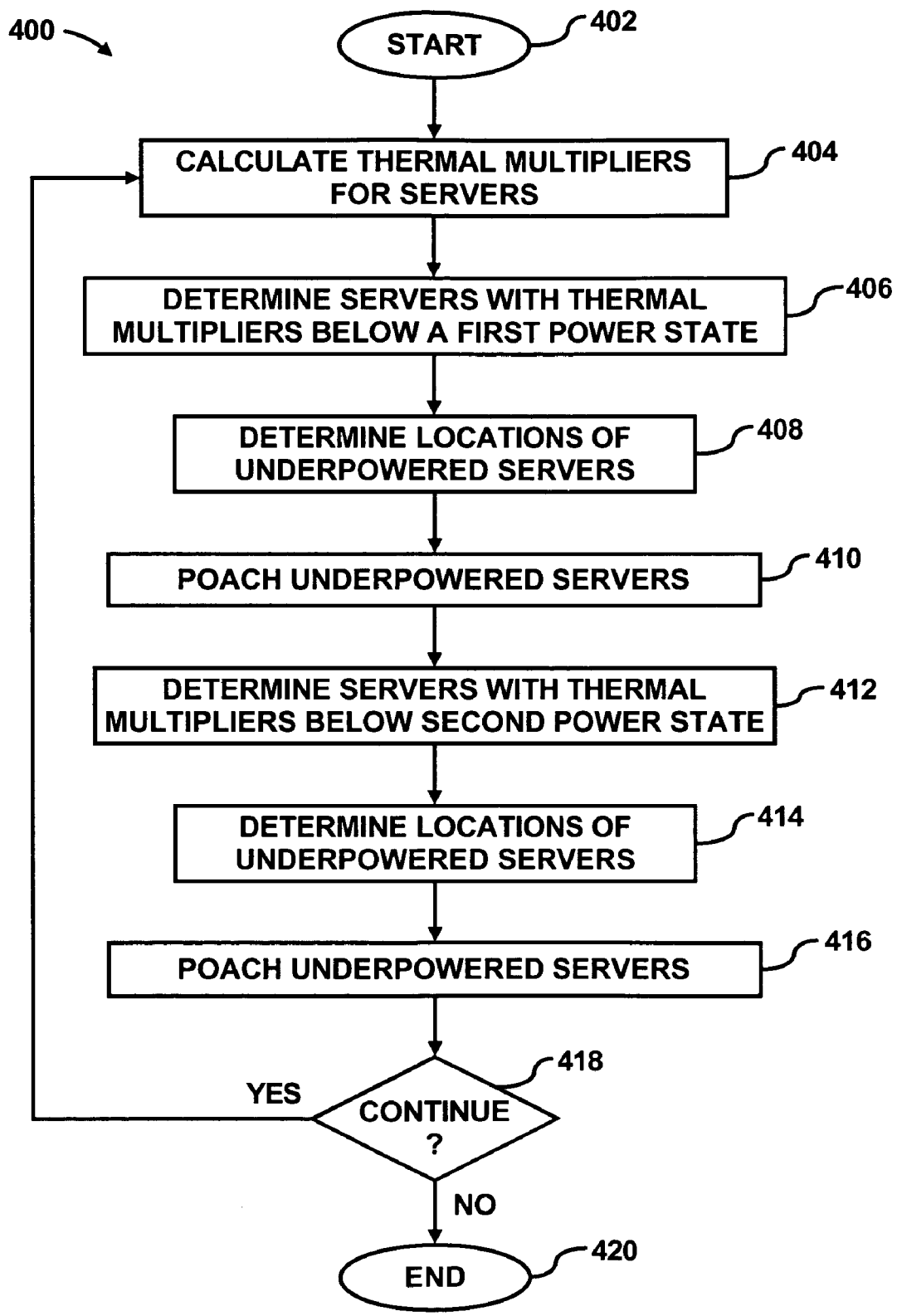
FIG. 4A shows a flow diagram of an operational mode for distributing power among servers, according to an embodiment of the invention.

With reference now to FIG. 4A, there is shown a flow diagram of an operational mode 400 for distributing power among servers. It is to be understood that the following description of the operational mode 400 is but one manner of a variety of different manners in which an embodiment of the invention may be practiced. It should also be apparent to those of ordinary skill in the art that the operational mode 400 represents a generalized illustration and that other steps may be added or existing steps may be removed, modified or rearranged without departing from a scope of the operational mode 400.

The description of the operational mode 400 is made with reference to the block diagram 200 illustrated in FIG. 2, and thus makes reference to the elements cited therein. It should, however, be understood that the operational mode 400 is not limited to the elements set forth in the block diagram 200. Instead, it should be understood that the operational mode 400 may be practiced by a power distribution system having a different configuration than that set forth in the block diagram 200.

The operational mode 400 may generally be implemented to maintain a substantially balanced temperature distribution in the data center 100. In one respect, the operational mode 400 is implemented to "discretize" the analog distribution of server 112a-112n thermal multipliers in the context of the server 112a-112n discrete power states. The "discretization" of the server 112a-112n thermal multipliers is based upon a proximity-based heat distribution and "poaching" and is performed in a way that minimizes errors over the entire data center 100 as well as over individual physically localized zones in the data center 100. In addition, the operational mode 400 may be employed to discourage the resource manager 120 from placing a relatively large amount of workload in a relatively small area, even if that area is more amenable to heat in general as determined by the thermal multipliers, by marking or otherwise indicating that power from that server 112a-112n has been poached.

As discussed in greater detail herein below, proximity-based poaching generally includes selective placement of workload via control over the server 112a-112n power states to maintain a substantially balanced temperature distribution in the data center 100. More particularly, if a workload is placed on a server 112a, the other servers 112b-112n in an area around the server 112a may be penalized, thereby making them less desirable for the next workload placement decision. Essentially, the selected server 112a "poaches" a portion of the analog power level assigned to its neighbors. The amount and ratio by which the server 112a poaches from its neighbors is adjustable and may be based upon the approximate ratios at which ambient heat from the selected server 112a will dissipate past its neighbors.

The operational mode 400 may be initiated, for instance, through receipt of a workload or application request by the resource manager 120 at step 402. In addition or alternatively, the operational mode 400 may be manually initiated, initiated according to an operating schedule, etc. Once initiated, the resource manager 120 may calculate thermal multipliers ($P_i$) for the servers 112a-112n as indicated at step 404. As stated above, the thermal multipliers ($P_i$) are equivalent to the optimal power consumption levels for the servers 112a-112n described above with respect to Equation (1).

Figure 4B:
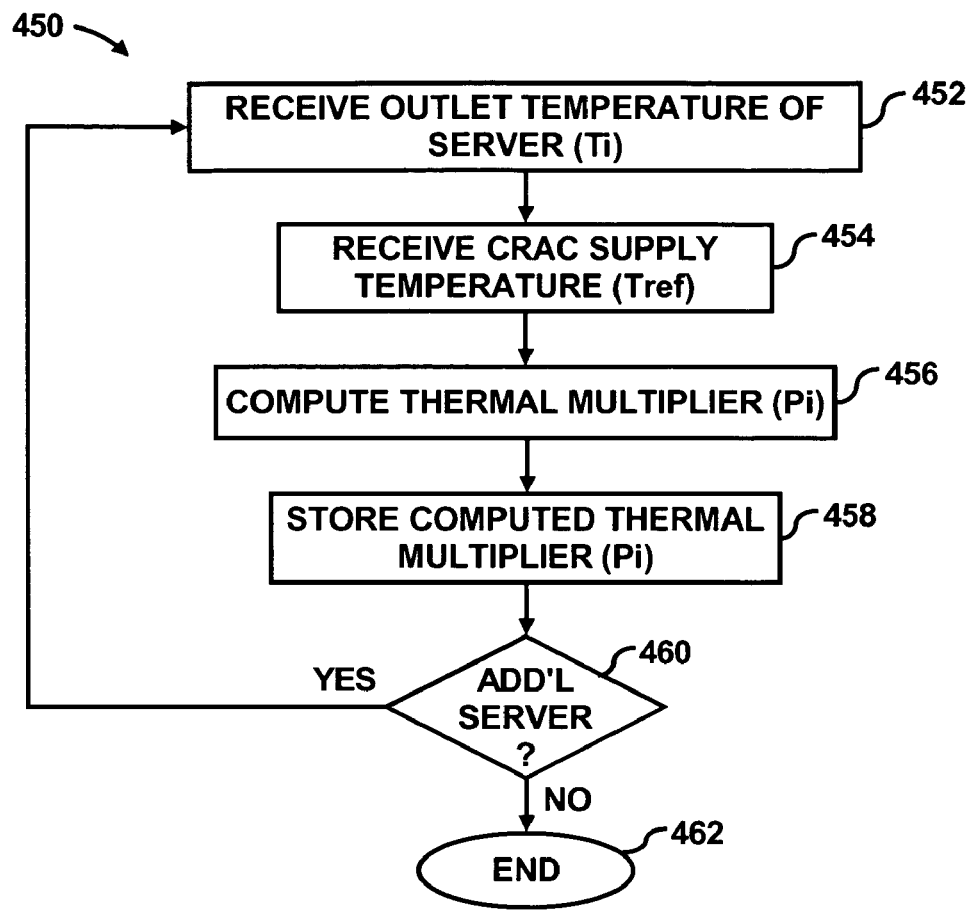
FIG. 4B shows a flow diagram of an operational mode for calculating thermal multipliers, according to an embodiment of the invention.

Illustrated in FIG. 4B is a flow diagram of an operational mode 450 for calculating the thermal multipliers ($P_i$). In this regard, the operational mode 450 may be performed as all or part of step 404 in the operational mode 400. The outlet temperature ($T_i$) of a server 112a (i) may be received by the resource manager 120 from the associated server temperature sensor 162a at step 452. In addition, the resource manager 120 may receive the CRAC supply temperature ($T_{ref}$) from an associated CRAC temperature sensor 230a at step 454. The resource manager 120 may implement the thermal multiplier module 218 to compute the thermal multiplier ($P_i$) of the server 112a through, for instance, application of Equation (1), at step 456. At step 458, the computed thermal multiplier ($P_i$) may be stored in the memory 210 or another data storage device.

At step 460, it may be determined as to whether the thermal multiplier ($P_i$) for another server 112b (i) is to be computed. If it is determined that the thermal multiplier ($P_i$) for another server 112b (i) is to be computed, steps 452-458 may be repeated for the another server 112b. In addition, steps 452-458 may be repeated for the remaining servers 112c-112n for which the thermal multiplier ($P_i$) is to be computed. If there are no further servers 112a-112c for which the thermal multipliers ($P_i$) are to be computed at step 460, the operational mode 450 may end as indicated at step 462.

An example of the computed thermal multipliers ($P_i$) for a number of servers 112a-112f are illustrated in FIG. 5A, which depicts a simplified diagram 500 of a row of racks 102a-102d, each housing a number of servers 112a-112n. The servers 112a-112f housed in the rack 102b are depicted with their respective thermal multipliers ($P_i$) shown in brackets. It should be understood that the thermal multiplier values depicted in FIG. 5A are for illustrative purposes only and are not meant to limit the invention in any respect.

As shown in FIG. 5A, the server 112c, which is located near the center of the row 102b has the highest thermal multiplier. In addition, the servers 112a and 112f located near the ends of the row 102b have the lowest thermal multipliers. The thermal multipliers for the servers 112a-112f may have the distribution depicted in FIG. 5A due to, for instance, the thermodynamic properties in the data center 100 as well as around the row 102b. In any regard, the thermal multiplier values for the servers 112a-112f are an analog distribution of ideal thermodynamic power consumption levels for the servers 112a-112f because they are not discrete values.

Referring back to FIG. 4A, the servers 112a-112n having thermal multipliers below a first power state may be determined at step 406. The first power state may comprise the first discrete power state at which the servers 112a-112n may operate. Thus, for instance, for servers having two discrete power states, the first power state may constitute the lower one of the two discrete power states. By way of example with respect to FIG. 4A, if the first power state is 50 Watts, then the only server having a thermal multiplier that is above the first power state is the server 112c.

At step 408, the resource manager 120 may determine the locations of the underpowered servers 112a-112n. The servers 112a-112n having thermal multipliers that are below the first power state may be considered as being underpowered with respect to the first power state because operating these servers 112a-112n at the first power state requires a greater amount of power than the thermal multipliers have indicated.

Figure 4C:
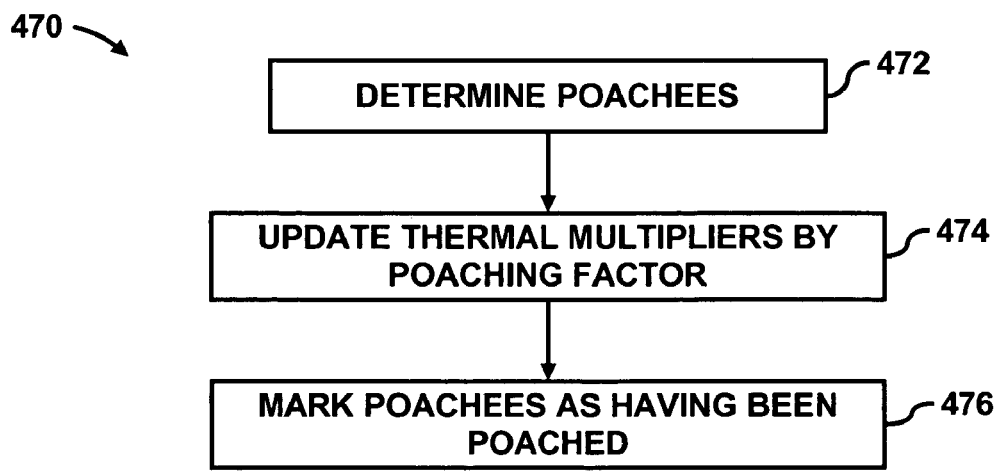
FIG. 4C shows a flow diagram of an operational mode for poaching power from various underpowered servers, according to an embodiment of the invention.

The underpowered servers 112a-112n may be poached at step 410. Illustrated in FIG. 4C is a flow diagram of an operational mode 470 for poaching power from various underpowered servers 112a-112n. In this regard, the operational mode 470 may be performed as all or part of step 410 in the operational mode 400.

At step 472, the poachees may be determined. That is, the servers 112a-112n that are underpowered and from which power allocation may be borrowed is determined at step 472. By way of example, the poacher server may be considered the server 112n having a thermal multiplier that most closely matches the optimal power consumption level for that server 112n. Alternatively, however, the poacher server may be selected relatively arbitrarily. In any respect, the amount of power allocation that may be borrowed from any individual server 112a-112n may be based upon a weighting of the respective server 112a-112n. In essence, poaching of those servers 112a-112n means that the weights assigned to the servers 112a-112n are de-weighted by a factor based upon the amount of power allocation borrowed from the servers 112a-112n. The factor by which the servers 112a-112n are poached, or the poaching factor, may considered as a function of the distance of a poachee server, for instance, server 112e from a poacher server, for instance, server 112d, in FIG. 4A. Thus, for instance, the poachee server may be in relatively close proximity to the poacher server. The "relatively close proximity" as used in this context may be defined as being within less than around ten servers in any direction from the poacher server. In certain instances, poachee servers may be considered as being in relatively close proximity to poacher servers if they are within two servers of the poacher servers in the vertical direction and one server of the poacher servers in the horizontal direction.

In addition, at step 474, the thermal multipliers of the servers 112a-112n may be updated based upon the poaching factor. For example, in FIG. 4A, if X Watts were poached from server A, the new thermal multiplier prediction for power is correspondingly reduced by X Watts. At step 476, the servers 112a-112n from which power allocation has been borrowed may be marked as having been poached and the operational mode 470 may end.

FIG. 5B illustrates a simplified diagram 550 of the row of racks 102a-102d depicted in FIG. 5A following step 410. More particularly, the diagram 550 illustrates that the power state of the server 112d has changed to 50 W. In addition, the server 112d has poached 15 W from the server 112e and 1.5 W from the server 112f. The servers 112e and 112f may be marked or otherwise identified as having been poached. As such, the resource manger 120 may substantially prevent future workloads from being assigned to the servers 112e and 112f.

Referring back to FIG. 4A, the servers 112a-112n having thermal multipliers below a second power state, but above the first power state, may be determined at step 412. The second power state may comprise the second discrete power state at which the servers 112a-112n may operate. Thus, for instance, for servers having two discrete power states, the second power state may constitute the higher one of the two discrete power states. By way of example with respect to FIG. 4A, if the second power state is 300 Watts, then the only server having a thermal multiplier that is above the first power state and is below the second power state is the server 112c.

At step 414, the resource manager 120 may determine the locations of the underpowered servers 112a-112n. The servers 112a-112n having thermal multipliers that are below the second power state may be considered as being underpowered with respect to the second power state because operating these servers 112a-112n at the second power state requires a greater amount of power than the thermal multipliers have indicated.

The underpowered servers 112a-112n may be poached at step 416. The underpowered servers 112a-112n may be poached as described herein with respect to the operational mode 470 depicted in FIG. 4C. In addition, with respect to the diagram 450 (FIG. 4B), the power state of the server 112c has changed to 300 W. In addition, the server 112c has poached 15 W from the server 112a and 33 W from the server 112b. The servers 112a and 112b may be marked or otherwise identified as having been poached. As such, the resource manger 120 may substantially prevent future workloads from being assigned to the servers 112a and 112b.

At step 418, it may be determined as to whether the operational mode 400 is to continue. The operational mode 400 may be continued for a predetermined period of time, a predetermined number of iterations, substantially indefinitely, etc. If it is determined that the operational mode 400 is to continue, steps 404-418 may be repeated until it is determined that the operation mode 400 is to discontinue. In this case, the operational mode 400 may be discontinued once the period of time has elapsed, the number of iterations has been performed, manually discontinued, etc. If it is determined that the operational mode 400 is to be discontinued, the operational mode 400 may end as indicated at step 420.

Figure 6A:
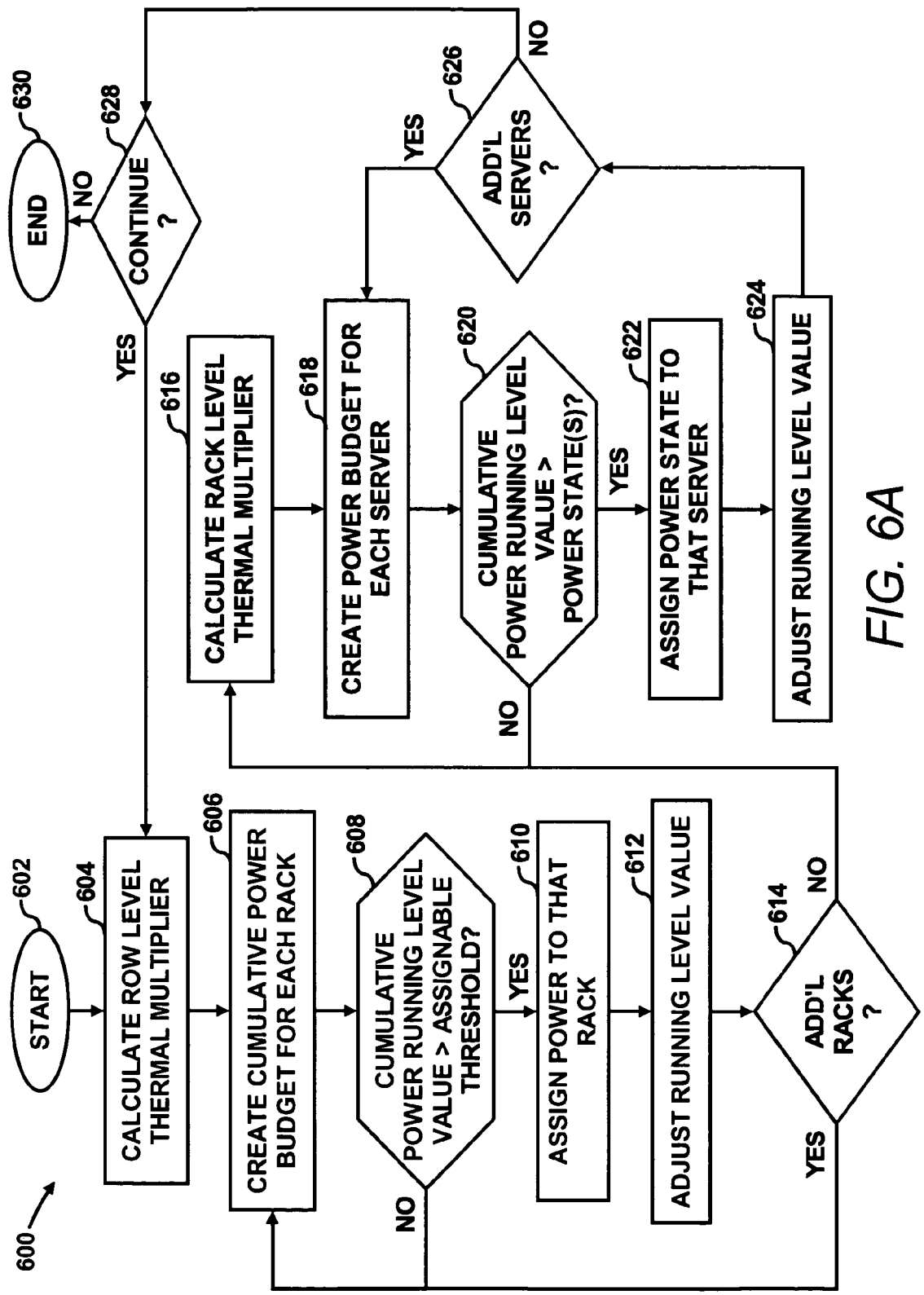
FIG. 6A shows a flow diagram of an operational mode for distributing power among servers, according to another embodiment of the invention.

With reference now to FIG. 6A, there is shown a flow diagram of an operational mode 600 for distributing power among servers according to another example. It is to be understood that the following description of the operational mode 600 is but one manner of a variety of different manners in which an embodiment of the invention may be practiced. It should also be apparent to those of ordinary skill in the art that the operational mode 600 represents a generalized illustration and that other steps may be added or existing steps may be removed, modified or rearranged without departing from a scope of the operational mode 600.

The description of the operational mode 600 is made with reference to the block diagram 200 illustrated in FIG. 2, and thus makes reference to the elements cited therein. It should, however, be understood that the operational mode 600 is not limited to the elements set forth in the block diagram 200. Instead, it should be understood that the operational mode 600 may be practiced by a power distribution system having a different configuration than that set forth in the block diagram 200.

The operational mode 600 may generally be implemented to maintain a substantially balanced temperature distribution in the data center 100. In one respect, the operational mode 600 is implemented to "discretize" the analog distribution of server 112a-112n thermal multipliers in the context of the server 112a-112n discrete power states. The "discretization" of the server 112a-112n thermal multipliers is based upon a proximity-based heat distribution and is performed under a two-pass approach. The first pass calculates the target power consumption for each rack, and translates that into an appropriate number of servers 112a-112n to use in each rack. The second pass then selects which of the servers 112a-112n to use within the racks. This approach is described in greater detail herein below.

The operational mode 600 may be initiated, for instance, through receipt of a workload or application request by the resource manager 120 at step 602. In addition or alternatively, the operational mode 600 may be manually initiated, initiated according to an operating schedule, etc. Once initiated, the resource manager 120 may calculate row level thermal multipliers ($P_i$) as indicated at step 604. More particularly, the resource manager 120 may determine the target power consumption levels for the racks in a particular row in the data center 100. As stated above, the thermal multipliers ($P_i$) are equivalent to the optimal power consumption levels for the servers 112a-112n described above with respect to Equation (1). In addition, or alternatively, the row level thermal multipliers (Pi) may be calculated as described in FIG. 3B of co-pending U.S. patent application Ser. No. 10/929,448.

Figure 6B:
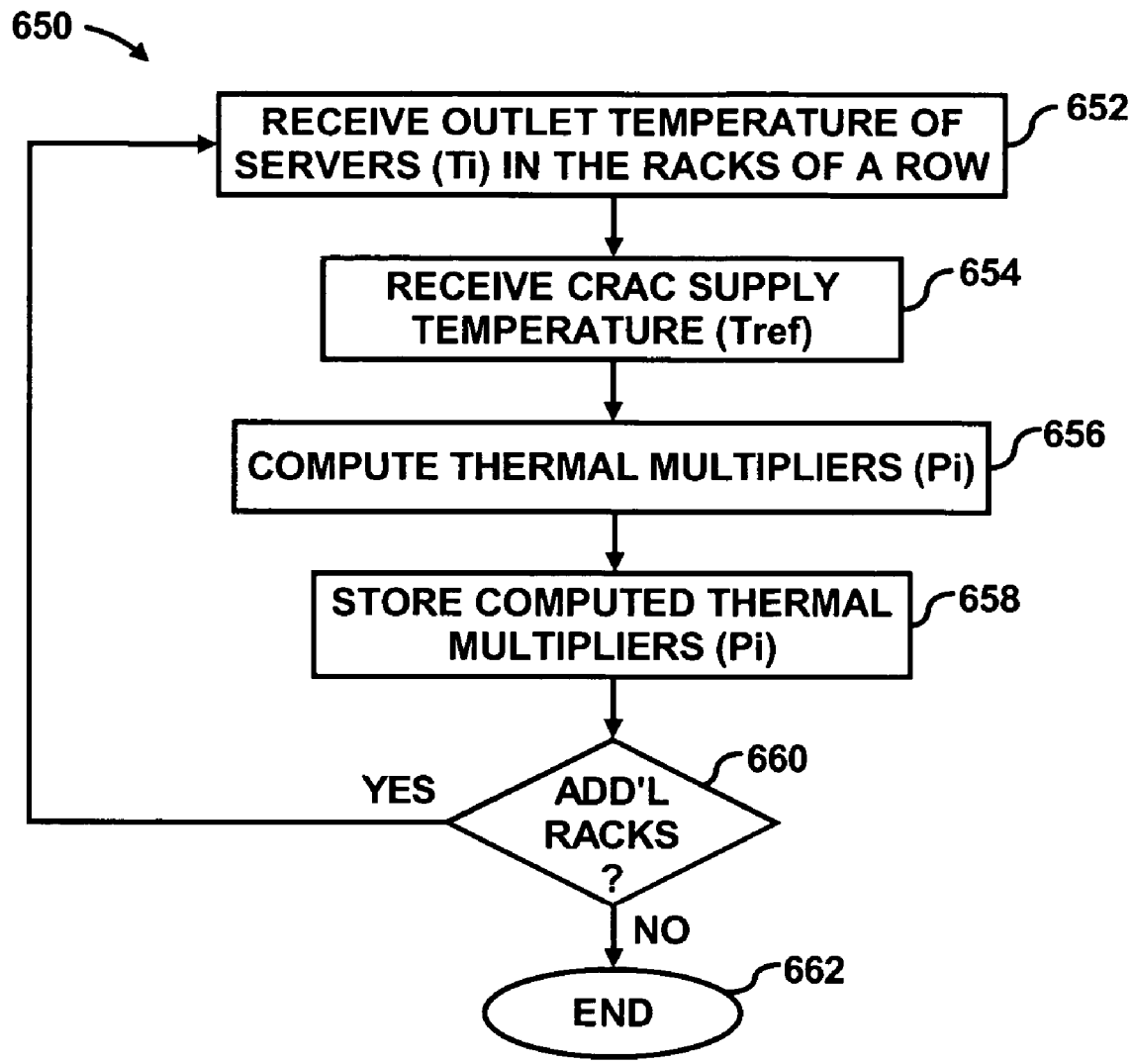
FIG. 6B shows a flow diagram of an operational mode for calculating thermal multipliers, according to another embodiment of the invention.

Illustrated in FIG. 6B is an operational mode 650 of a method for calculating the row level thermal multipliers ($P_i$). In this regard, the operational mode 650 may be performed as all or part of step 604 in the operational mode 600. The outlet temperatures ($T_i$) of the servers 112a (i) in the racks of a particular row may be received by the resource manager 120 from the associated server temperature sensors 162a at step 652. In addition, the resource manager 120 may receive the CRAC supply temperature ($T_{ref}$) from an associated CRAC temperature sensor 230a at step 654. The resource manager 120 may implement the thermal multiplier module 218 to compute the thermal multipliers ($P_i$) of the servers 112a-112n through, for instance, application of Equation (1), at step 656. At step 658, the computed thermal multipliers ($P_i$) may be stored in the memory 210 or another data storage device.

At step 660, it may be determined as to whether the thermal multipliers ($P_i$) for the servers 112a-112n (i) in another rack are to be computed. If it is determined that the thermal multipliers ($P_i$) for the servers 112a-112n (i) in another rack are to be computed, steps 652-658 may be repeated for the servers 112a-112n of the another rack. In addition, steps 652-658 may be repeated for the servers 112a-112n of additional racks for which the thermal multipliers ($P_i$) are to be computed. If there are no further servers 112a-112c for which the thermal multipliers ($P_i$) are to be computed at step 660, the operational mode 650 may end as indicated at step 662.

An example of the computed thermal multipliers ($P_i$) for a number of servers 112a-112n are illustrated in FIG. 7A, which depicts a simplified diagram 700 of a row of racks 102a-102d, similar to FIG. 5A. The servers 112a-112n housed in the racks 102a-102d are depicted with their respective thermal multipliers ($P_i$) shown in brackets. It should be understood that the thermal multiplier values depicted in FIG. 7A are for illustrative purposes only and are not meant to limit the invention in any respect. In addition, although four racks 102a-162d are illustrated in FIG. 7A, each containing six servers, the principles described herein may be applied to any reasonably suitable number of racks containing any reasonably suitable number of servers.

The thermal multipliers for the servers 112a-112n may have the distribution depicted in FIG. 7A due to, for instance, the thermodynamic properties in the data center 100 as well as around the racks 102a-102d. In any regard, the thermal multiplier values for the servers 112a-112n are an analog distribution of ideal thermodynamic power consumption levels for the servers 112a-112f because they are not discrete levels.

With reference back to FIG. 6A, the cumulative power budget for each of the racks 102a-102d may be created based upon the calculated thermal multipliers ($P_i$), at step 606. More particularly, as shown in FIG. 7A, the total power budgets for each of the racks 102a-102d may be considered as the sum of the thermal multipliers for the servers 102a-102n contained in the respective racks 102a-102d. Examples of the total power budgets for the racks 102a-102d are shown in FIG. 7A. In addition, at step 606, a running total of the cumulative power levels for the racks 102a-102d may be calculated to determine when the cumulative power running level value of the racks 102a-102n exceeds an assignable threshold. The assignable threshold may be chosen based upon the specific approach taken. For example, the assignable threshold may be chosen to be close to the median or mean of the expected power values.

At step 608, the cumulative power running level values for the racks 102a-102d may be compared to the assignable threshold. That is, for a given rack 102a-102d, it may be determined as to whether the sum of the thermal multipliers for that rack 102a-102d exceeds the assignable threshold. More particularly, if the power budget for a first rack 102a falls below the assignable threshold, the power budget for the first rack 102a may be assigned little or no power and the power budget for the first rack 102 a may be added to the power budget of the second rack 102b. If the cumulative power budget for the second rack 102b, which includes the power budget for the first rack 102a, does not exceed the assignable threshold, the cumulative power budget for the second rack 102b may be added to the power budget for a third rack 102c. As such, the power budgets for the racks 102a-102d may be accumulated on a running level until the cumulative power budget for a rack 102a-102d exceeds the assignable threshold.

If the cumulative power running level value for a rack 102a-102d exceeds the assignable threshold, then power in the level of the assignable threshold is assigned to that rack 102a-102d at step 610. In addition, the running level value of the cumulative power budgets may be adjusted at step 612. More particularly, if there is an amount of power budget remaining following assignment of the power to the rack, the cumulative power running level may be adjusted so that it starts with the remaining amount of power budget. Thus, for instance, if 25 W were remaining following placement of power to a rack 102a, the running level for the next rack 102b would begin at 25 W.

At step 614, it may be determined as to whether the power levels for any additional racks are to be adjusted. If "yes", the cumulative power budget for the next rack may be created at step 606, beginning with the running level adjusted at step 612. In addition, steps 608-612 may be repeated for the remaining racks. If "no", the operational mode 600 may continue by assigning workload to the actual servers 112a-112n in the racks 102a-102d based upon the power levels assigned to the racks 102a-102d. Prior to a more detailed description of these steps, an example illustrating steps 606-612 is now provided with respect to FIGS. 7A and 7B.

If the assignable threshold is 400 W, it is seen in FIGS. 7A and 7B that the cumulative power level for the rack 102a is below that assignable threshold. Thus, as shown in the diagram 710, the power level for the rack 102a may be set to zero and the cumulative power level for rack 102a may be added to the power budget for rack 102b. In this case, the cumulative power running level for rack 102b is now 170 W+255.5 W, which equals 425.5 W. The power level for the rack 102b may be set to 400 W and the remaining 25.5 W may be added to the next rack 102c. Thus, the cumulative running power level for rack 102c is 148 W+25.5 W, which equals 173.5 W. Because the cumulative power level for rack 102c is below the 400 W threshold, the power level for the rack 102c may be set to zero and the remaining power (173.5 W) may be added to the next rack 102d. Thus, the cumulative running power level value for the rack 102d may be 173.5 W+142.5 W, which equals 316 W. The power level of the rack 102d may be set to zero and the 316 W may be added to the power level of another rack in the row 102. Alternatively, if the rack 102d is the last rack in the row 102, the power of the rack 102d may be set to 400 W.

Although the example above indicated that the running value of the cumulative power budgets began with the leftmost rack 102a and proceeded to the right of the rack 102a, it should be understood that the running value of the cumulative power budgets may begin with any of the racks 102a-102d and may run in either direction without departing from a scope of the operational mode 600.

At step 616, the resource manager 120 may calculate rack level thermal multipliers ($P_i$). More particularly, the resource manager 120 may determine the target power consumption levels for the servers 112a-112n in a particular rack 102a-102d based upon the power levels assigned to the racks 102a-102d at step 610. Thus, the thermal multipliers ($P_i$) for the servers 112a-112n may be varied from their calculations at step 604. In addition, the thermal multipliers ($P_i$) for the servers 112a-112n may be calculated as described above with respect to FIG. 3B.

An example of the thermal multipliers ($P_i$) computed at step 616 are illustrated in FIG. 7C, which depicts a simplified diagram 720 of a row of racks 102a-102d, following performance of step 616. As shown in FIG. 7C, the racks 102a and 102c, which were not assigned power at step 610, each contain servers that are not assigned any thermal multipliers. Alternatively, the servers contained in the racks 102a and 102c may be considered as having thermal multipliers equal to zero. In addition, the servers contained in the racks 102b and 102d have thermal multipliers that are higher than their counterpart values in FIG. 7A. This increase in thermal multiplier values for the servers in the racks 102a and 102c is a result of the additional workload assigned to the racks 102b and 102d as determined at step 610.

With reference back to FIG. 6A, the power budgets for the servers 112a-112n in the racks 102b and 102d may be created based upon the calculated thermal multipliers ($P_i$), at step 618. In addition, a running total of the cumulative power levels for the servers 112a-112n in the racks 102b and 102d may be calculated to determine when the cumulative power running level value of the servers 112a-112n exceeds an assignable threshold. The assignable threshold may be either or both of the first power state and the second power state of the servers 112a-112n described in greater detail herein above.

At step 620, the cumulative power running level values for the servers 112a-112n may be compared to one or more power states. That is, for a given server 112a-112n, it may be determined as to whether the thermal multiplier for that server 112a-112n exceeds one or more of the power states. More particularly, if the power budget for a first server 112a falls below one or more of the power states, the power budget for the first server 112a may not be assigned any power and the power budget for the first server 112a may be added to the power budget of a second server 112b. If the cumulative power budget for the second server 112b does not exceed one or more of the power states, the cumulative power budget for the second server 112b may be added to the power budget for a third server 112c, and so forth. As such, the power budgets for the servers 112a-112d contained in the racks assigned to receive power, may be accumulated on a running level until the cumulative power budget for a server 112a-112n exceeds one or more of the power states.

If the cumulative power running level value for a server 112a-112n exceeds one or more of the power states, then the power state in the level of the power state that is exceeded is assigned to that server 112a-112n at step 622. In addition, the running level value of the cumulative power budgets may be adjusted at step 624. More particularly, if there is an amount of power budget remaining following assignment of the power state to the server 112a-112n, the cumulative power running level may be adjusted so that it starts with the remaining amount of power budget. Thus, for instance, if 30 W were remaining following placement of power to a server 112a, the running level for the next server 112b would begin at 30 W.

An example of how the power states of the servers 112a-112n may be assigned based upon the cumulative power running level is now provided with respect to FIGS. 7C and 7D. As stated above, FIG. 7C depicts a diagram 720 of the thermal multipliers for the servers 112a-112n contained in the racks 102a-102d. Thus, the diagram 720 depicts that ideal thermodynamic power consumption levels for the servers 112a-112n. FIG. 7D depicts a diagram 730 of the power states for the servers 112a-112n based upon the cumulative power running levels shown in FIG. 7C. In the following example, the first power state is considered to be 50 W and the second power state is considered to be 200 W. It should be understood that these values for the first and second power states are for illustrative purposes only and are not intended to limit the invention in any respect.

Beginning with the bottommost server 112a in the rack 102b, the assigned power state is zero because the cumulative power budget, in this case, the power budget for the server 112a(1.5 W) is below the first power state (50 W). The next server 112b has been assigned a power state of 50 W because the cumulative power budget for that server 112b exceeds the first power state. The excess power remaining from the assignment of the server 112b with 50 W is 7 W, which is the adjusted running level value from which the thermal multiplier for the server 112c is added. Therefore, the remaining 7 W is added to the thermal multiplier 142 W of the server 112c yielding 149 W. Because this cumulative running value is above the first power state but below the second power state, the server 112c is assigned with the first power state (50 W). The remaining 99 W is added to the thermal multiplier (150 W) of the next server 112d, yielding 249 W. Thus, the server 112d is assigned the second power state because the cumulative running value for that server 112d is above the second power state. The remaining power (49 W) is added to the thermal multiplier (33) of the next server 112e, which yields 82 W. Thus, the server 112e is assigned the first power state. The next server 112f is assigned the first power state because the cumulative running power value equals 50 W.

Although the example above indicated that the running value of the cumulative power budgets began with the bottommost server 112a and proceeded upwards, it should be understood that the running value of the cumulative power budgets may begin with any of the servers 112a-112f and may run in either direction without departing from a scope of the operational mode 600. Thus, for instance, the running value of the cumulative power budgets may begin with the server 112c, for instance.

At step 626, it may be determined as to whether the power levels for any additional servers 112a-112n are to be adjusted. If "yes", the power budget for the next server may be created at step 618, beginning with the running level adjusted at step 624. In addition, steps 618-624 may be repeated for remaining servers. If "no", the operational mode 600 may determine whether it is to continue as indicated at step 628.

If it is determined that the operational mode 600 is to continue, steps 604-628 may be repeated until it is determined that the operation mode 600 is to discontinue. In this case, the operational mode 600 may be discontinued once a predetermined period of time has elapsed, a predetermined number of iterations has been performed, the operational mode 600 has been manually discontinued, etc. If it is determined that the operational mode 600 is to be discontinued, the operational mode 600 may end as indicated at step 630.

According to another example, the power distribution among the servers 112a-112n may be based upon a combination of the operational modes 400 and 600. For instance, the first pass, comprising steps 604-614, may be implemented to calculate the target power consumption for each rack 102a-102d. In addition, in place of performing the second pass, comprising steps 616-626, steps 404-418 may be implemented to assign the power states to the servers 112a-112n in the racks 102a-102d. In this regard, workloads may be assigned to the servers 112a-112n in manners to maintain a substantially balanced temperature distribution in both the horizontal and vertical directions with respect to the racks 102a-102d and the servers 112a-112n.

The operations set forth in the operational modes 300, 310, 400, 450, 470, 600, 650 may be contained as a utility, program, or subprogram, in any desired computer accessible medium. In addition, the operational modes 300, 310, 400, 450, 470, 600, 650 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 8:
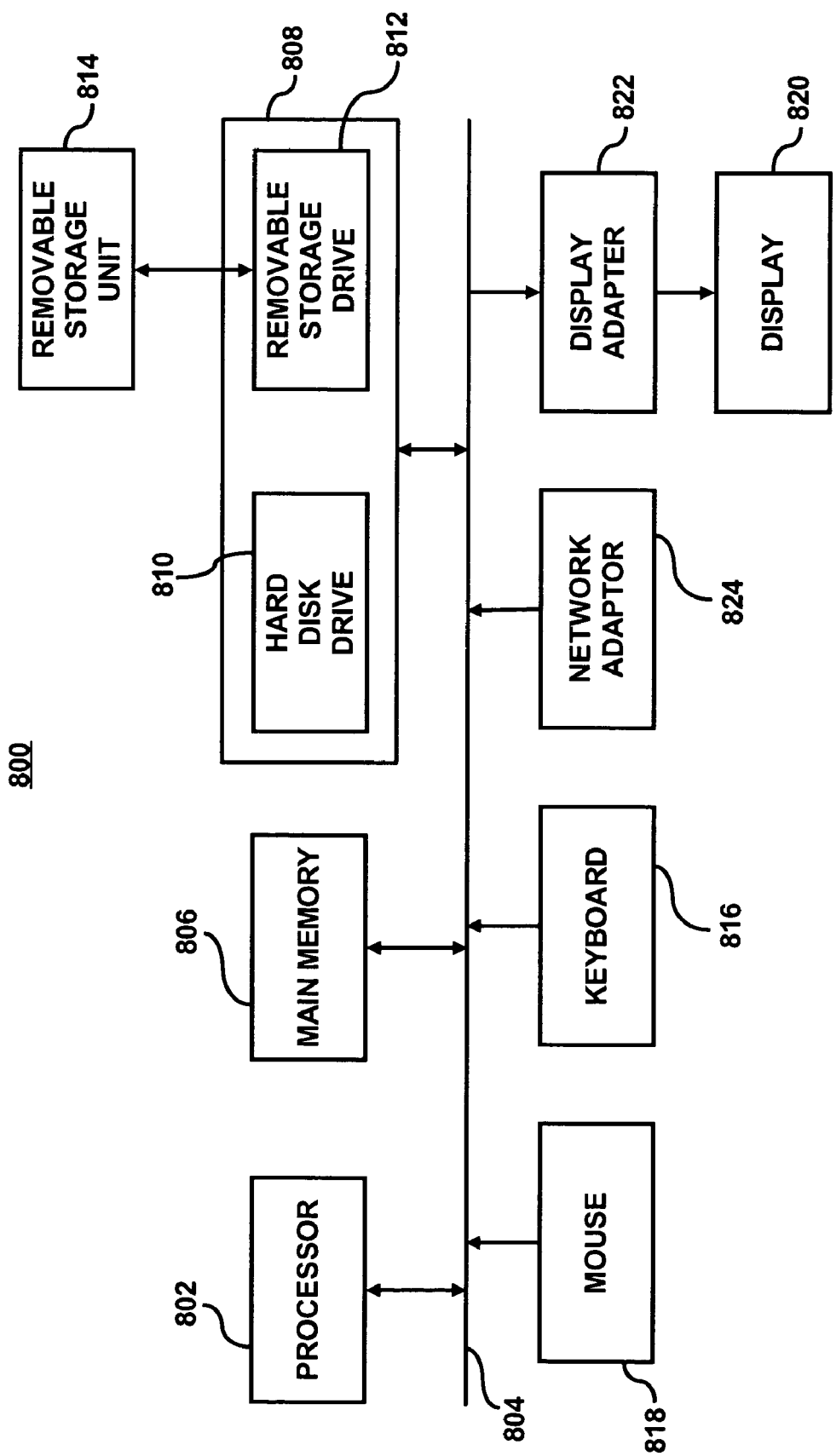
FIG. 8 illustrates a computer system, which may be employed to perform the various functions of the power distribution system, according to an embodiment of the invention.

FIG. 8 illustrates a computer system 800, which may be employed to perform the various functions of the resource manager 120 described hereinabove, according to an embodiment. In this respect, the computer system 800 may be used as a platform for executing one or more of the functions described hereinabove with respect to the resource manager 120.

The computer system 800 includes one or more controllers, such as a processor 802. The processor 802 may be used to execute some or all of the steps described in the operational modes 300, 310, 400, 450, 470, 600, 650. Commands and data from the processor 802 are communicated over a communication bus 804. The computer system 800 also includes a main memory 806, such as a random access memory (RAM), where the program code for, for instance, the resource manager 120, may be executed during runtime, and a secondary memory 808. The secondary memory 808 includes, for example, one or more hard disk drives 810 and/or a removable storage drive 812, representing a floppy diskette drive, a magnetic tape drive, a compact disk drive, etc., where a copy of the program code for the power distribution system may be stored.

The removable storage drive 810 reads from and/or writes to a removable storage unit 814 in a well-known manner. User input and output devices may include a keyboard 816, a mouse 818, and a display 820. A display adaptor 822 may interface with the communication bus 804 and the display 820 and may receive display data from the processor 802 and convert the display data into display commands for the display 820. In addition, the processor 802 may communicate over a network, for instance, the Internet, LAN, etc., through a network adaptor 824.

It will be apparent to one of ordinary skill in the art that other known electronic components may be added or substituted in the computer system 800. In addition, the computer system 800 may include a system board or blade used in a rack in a data center, a conventional "white box" server or computing device, etc. Also, one or more of the components in FIG. 8 may be optional (for instance, user input devices, secondary memory, etc.).

What has been described and illustrated herein are embodiments of the invention along with some of their variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of distributing power among servers, said method comprising:
    calculating thermal multipliers of the servers, wherein the thermal multipliers represent recommended thermodynamic power consumption levels for the servers;
    discretizing the thermal multipliers of the servers to one of a plurality of server power states based upon geographic locations of the servers; and
    assigning one of the plurality of server power states to the servers based upon the discretization of the thermal multipliers; and
    wherein said step of discretizing the thermal multipliers of the servers comprises determining servers having thermal multipliers close to a first power state; and for a first poacher server, poaching power from at least one first poachee server having a thermal multiplier below the first power state.

2. The method according to claim 1, further comprising:
receiving outlet temperatures of the servers;
receiving at least one CRAC unit supply air temperature; and
wherein the step of calculating the thermal multipliers further comprises computing the thermal multipliers based upon a ratio of the at least one CRAC unit supply air temperature and the outlet temperatures of the servers.

3. The method according to claim 2, wherein the step of calculating the thermal multipliers ($P_i$) for each of the servers (i) is based upon at least one of thermodynamic modeling, dimensionless parameters, re-circulation, and history-based profiling.

4. The method according to claim 1, wherein the step of calculating the thermal multipliers further comprises calculating the thermal multipliers during an operation time using monitoring.

5. The method according to claim 1, wherein the step of calculating the thermal multipliers further comprises calculating the thermal multipliers through modeling.

6. The method according to claim 1,
wherein the at least one first poachee server is in relative close proximity to the first poacher server.

7. The method according to claim 6, further comprising:
updating the thermal multiplier of the at least one poachee server by a first poaching factor, wherein the first poaching factor is a function of a distance between the first poacher server and the at least one first poachee server; and
marking the at least one first poachee server as having been poached.

8. The method according to claim 1, wherein the step of discretizing the thermal multipliers of the servers further comprises an iterative multi-step procedure, said iterative multi-step procedure further comprising:
discretizing the thermal multipliers of the servers based upon geographically clustered collections of racks in increasing granularity.

9. The method according to claim 1, wherein the step of discretizing the thermal multipliers of the servers further comprises an iterative multi-step procedure, said iterative multi-step procedure further comprising:
discretizing the thermal multipliers based upon a sequential ordering of the thermal multipliers.

10. The method according to claim 9, wherein the step of discretizing the thermal multipliers based upon a sequential ordering of the thermal multipliers further comprises using the highest thermal multiplier first in discretizing the thermal multipliers.

11. The method according to claim 1, wherein the step of discretizing the thermal multipliers of the servers further comprises an iterative multi-step procedure, said iterative multi-step procedure further comprising:
calculating the target power consumption levels for a plurality of racks in a row of racks; and
determining the one of the plurality of server power states to assign to the servers contained in the plurality of racks.

12. The method according to claim 11, wherein the step of determining the one of the plurality of power states to assign comprises:
calculating thermal multipliers for the servers based upon the calculated target power consumption levels for a plurality of racks;
creating power budgets for the servers contained in the plurality of racks; and
determining whether the power budget for a first server in a first rack of the plurality of racks exceeds at least one of the plurality of server power states.

13. The method according to claim 12, further comprising:
in response to the power budget for the first server exceeding a first server power state of the plurality of server power states, assigning the first server the first server power state; and
adjusting a cumulative power budget for a second rack based upon a difference between the cumulative power budget for the first rack and the first server power state.

14. The method according to claim 12, further comprising:
in response to the power budget for the first server falling below the plurality of server power states, adding the power budget for the first server to the power budget for a second servers and
determining whether the cumulative power budget for the first server and the second server exceeds at least one of the plurality of plurality of server power states.

15. The method according to claim 14, further comprising:
in response to the cumulative power budget exceeding a first server power state of the plurality of server power states, assigning the first server a zero power level;
assigning the second rack the first server power state; and
adjusting the cumulative power budget for a third server based upon a difference between the cumulative power budget and the first server power state.

16. The method according to claim 11, wherein the at least one first poachee server having a thermal multiplier below the first power state is in relative close proximity to the first poacher server, and wherein the step of determining the one of the plurality of power states to assign the servers contained in the plurality of racks further comprises:
determining servers having thermal multipliers below a second power state, wherein the second power state is higher than the first power state;
for a second poacher server, poaching power from at least one second poachee server having a thermal multiplier below the second power state, wherein the at least one second poachee server having thermal multiplier below the second power state is in relative close proximity to the second poacher server;
updating the thermal multiplier of the at least one second poachee server having a thermal multiplier below the second power state by a second poaching factor, wherein the second poaching factor is a function of a distance between the second poacher server and the at least one second poachee server having a thermal multiplier below the second power state; and
marking the at least one second poacher server having a thermal multiplier below the second power state as having been poached.

17. A method of distributing power among servers, said method comprising;
calculating thermal multipliers of the servers, wherein the thermal multipliers represent recommended thermodynamic power consumption levels for the servers;
discretizing the thermal multipliers of the servers to one of a plurality of server power states based upon geographic locations of the servers;

assigning one of the plurality of server power states to the servers based upon the discretization of the thermal multipliers;

wherein the step of discretizing the thermal multipliers of the servers comprises an iterative multi-step procedure, said iterative multi-step procedure further comprising;

calculating the target power consumption levels for a plurality of racks in a row of racks; and determining the one of the plurality of power states to assign to the servers contained in the plurality of racks;

wherein the step of calculating the target power consumption levels comprises:

calculating thermal multipliers for the plurality of racks;

creating a cumulative power budget for the plurality of racks, wherein the cumulative power budget for a rack in the plurality of racks comprises a sum of the thermal multipliers of the servers contained in the rack; and determining whether the cumulative power budget for a first rack in the plurality of racks exceeds an assignable threshold power level.

18. The method according to claim 17, further comprising:
assigning the first rack the assignable threshold power level in response to the cumulative power budget for the first rack exceeding the assignable threshold power level; and adjusting the cumulative power budget for a second rack based upon a difference between the cumulative power budget for the first rack and the assignable threshold power level.

19. The method according to claim 17, further comprising:
adding the cumulative power budget for the first rack to the cumulative power budget for a second rack in response to the cumulative power budget for the first rack falling below the assignable threshold power level; and determining whether the added cumulative power budget for the second rack exceeds the assignable threshold power level.

20. A system for distributing power among servers, said system comprising:
server temperature sensors configured to detect the temperatures of airflow exhausted from the servers;
a CRAC unit temperature sensor configured detect the temperature of airflow supplied by the CRAC unit;
a resource manager configured to receive the detected server exhaust temperatures and the CRAC unit supply temperature and to calculate thermal multipliers for the servers based upon the respective detected server exhaust temperatures and the CRAC unit supply air temperature, said resource manager being further configured to discretize the thermal multipliers of the servers to one of a plurality of server power states based upon geographic locations of the servers, and wherein the resource manager is configured to distribute power by assigning one of the plurality of server power states to the servers based upon the discretization of the thermal multipliers;

wherein the resource manager is further configured to determine servers having thermal multipliers below a first power state and to poach power from at least one first poachee server having a thermal multiplier below the first power state.

21. The system according to claim 20, wherein the resource manager is further configured to calculate the thermal multipliers ($P_i$) for each of the serves (i) based upon at least one of thermodynamic modeling dimensionless parameters, re-circulation, and histoy-based profiling.

22. The system according to claim 20, wherein the resource manager is further configured to give the poached power from the at least one first poachee server to a first poacher server thereby increasing the thermal multiplier of the first poacher server to around the first power state, wherein the first poacher server is in relatively close proximity to the at least one first poachee server.

23. The system according to claim 22, wherein the resource manager is further configured to determine servers having thermal multipliers below a second power state and above the first power state and to poach power from at least one second poachee server having a thermal multiplier below the second power state and above the first power state and to give the poached power from the at least one second poachee server to a second poacher server thereby increasing the thermal multiplier of the second poacher server to the around the second power state, wherein the second poacher server is in relatively close proximity to the at least one second poachee server.

24. The system according to claim 23, wherein the resource manager is further configured to update the thermal multipliers of the at least one second poachee server by a second poaching factor, wherein the second poaching factor is a function of a distance between the second poacher server and the at least one second poachee server, and wherein the resource manager is further configured to mark the least one second poachee server as having been poached.

25. The system according to claim 20, wherein the resource manager is further configured to calculate target power consumption levels for a plurality of racks in a row of racks and to determine the one of the plurality of power states to assign to the servers contained in the plurality of racks.

26. The system according to claim 25, wherein the resource manager is further configured to compare a cumulative power budget for the racks to an assignable threshold power level and to assign the threshold power levels to those racks having cumulative power budgets that exceed the assignable threshold power level.

27. The system according to claim 26, wherein the resource manager is further configured to calculate said thermal multipliers for the servers based upon the calculated target power consumption levels for a plurality of racks, to create power budgets for the servers contained in the plurality or racks and to assign said power states to the servers based upon a comparison of the thermal multipliers and the power states.

28. The system according to claim 25, wherein the resource manager is farther configured to give the poached power from the at least one first poachee server to a first poacher server thereby increasing the thermal multiplier of the first poacher server to around the first power state, wherein the first poacher server is in relatively close proximity to the at least one first poachee server.

29. The system according to claim 28, wherein the resource manager is further configured to determine servers having thermal multipliers below a second power state and above the first power state and to poach power from at least one second poachee server having a thermal multiplier below the second power state and above the first power state and to give the poached power from the at least one second poachee server to a second poacher server thereby increasing the thermal multiplier of the second poacher server to the around the second power state, wherein the second poacher server is in relatively close proximity to the at least one second poachee server.

30. A data center having a system far power distribution among servers, said data center comprising:
means for detecting temperatures of airflow exhausted from the servers;

means for detecting a temperature of die airflow supplied from a CRAC unit;

means for controlling power distribution in the data center, said means for controlling comprising means for calculating thermal multipliers of the servers, means for discretizing the thermal multipliers of the servers to one of a plurality of server power states based upon geographic locations of the servers, and means for assigning one of the plurality of server power states to the servers based upon the discretization of the thermal multiplier; and means for determining servers having thermal multipliers below a first power state and to poach power from at least one first poachee server having a thermal multiplier below the first power suite.

31. A tangible computer readable storage medium on which is embedded one or more computer programs, said one or more computer programs implementing a method of distributing power among servers, said one or more computer programs comprising a set of instructions for;

calculating thermal multipliers of the servers;

discretizing the thermal multipliers of the servers to one of a plurality of server power states based upon geographic locations of the servers;

assigning one of the plurality of server power states to the servers based upon the discretization of the thermal multipliers;

determining servers having thermal multipliers close to a first power state; and for a first poacher server, poaching power from at least one first poachee server having a thermal multiplier below the first power state.

* * * * *

UNITED STATES PATENT AND TRADEMARK OFFICE
CERTIFICATE OF CORRECTION

PATENT NO. : 7,461,273 B2
APPLICATION NO. : 11/129988
DATED : December 2, 2008
INVENTOR(S) : Justin Moore et al.

It is certified that error appears in the above-identified patent and that said Letters Patent is hereby corrected as shown below:

In column 9, line 50, after "multipliers" delete "$(P_1)$" and insert -- $(P_i)$ --, therefor.

In column 16, line 10, delete "102a-162d" and insert -- 102a-102d --, therefor.

In column 22, line 22, in Claim 14, delete "servers" and insert -- server; --, therefor.

In column 22, line 47, in Claim 16, after "having" insert -- a --.

In column 22, line 57, in Claim 16, delete "poacher" and insert -- poachee --, therefor.

In column 22, line 61, in Claim 17, after "comprising" delete ";" and insert -- : --, therefor.

In column 23, line 65, in Claim 21, delete "serves" and insert -- servers --, therefor.

In column 23, line 66, in Claim 21, after "modeling" insert -- , --.

In column 23, line 67, in Claim 21, delete "histoy-based" and insert -- history-based --, therefor.

In column 24, line 43, in Claim 27, after "plurality" delete "or" and insert -- of --, therefor.

In column 24, line 47, in Claim 28, delete "farther" and insert -- further --, therefor.

In column 24, line 64, in Claim 30, after "system" delete "far" and insert -- for --, therefor, In column 25, line 1, in Claim 30, delete "die" and insert -- the --, therefor.

In column 25, line 10, in Claim 30, delete "multiplier;" and insert -- multipliers; --, therefor.

In column 25, line 15, in Claim 30, delete "suite" and insert -- state --, therefor.

UNITED STATES PATENT AND TRADEMARK OFFICE
CERTIFICATE OF CORRECTION

PATENT NO. : 7,461,273 B2
APPLICATION NO. : 11/129988
DATED : December 2, 2008
INVENTOR(S) : Justin Moore et al.

It is certified that error appears in the above-identified patent and that said Letters Patent is hereby corrected as shown below:

In column 26, line 3, in Claim 31, delete "for;" and insert -- for: --, therefor.

Signed and Sealed this

Twenty-fifth Day of August, 2009

David J. Kappos
*Director of the United States Patent and Trademark Office*